(12) United States Patent
Hiromatsu et al.

(10) Patent No.: US 10,042,247 B2
(45) Date of Patent: Aug. 7, 2018

(54) MASK BLANK, METHOD FOR MANUFACTURING MASK BLANK AND TRANSFER MASK

(71) Applicants: HOYA CORPORATION, Tokyo (JP); NISSAN CHEMICAL INDUSTRIES, LTD., Tokyo (JP)

(72) Inventors: Takahiro Hiromatsu, Tokyo (JP); Masahiro Hashimoto, Tokyo (JP); Yasushi Sakaida, Toyama (JP); Ryuta Mizuochi, Toyama (JP); Rikimaru Sakamoto, Toyama (JP); Masaki Nagai, Tokyo (JP)

(73) Assignees: HOYA CORPORATION, Tokyo (JP); NISSAN CHEMICAL INDUSTRIES, LTD., Tokyo (JP)

(*) Notice: Subject to any disclaimer, the term of this patent is extended or adjusted under 35 U.S.C. 154(b) by 0 days.

(21) Appl. No.: 15/511,555

(22) PCT Filed: Aug. 25, 2015

(86) PCT No.: PCT/JP2015/073892
§ 371 (c)(1),
(2) Date: Mar. 15, 2017

(87) PCT Pub. No.: WO2016/047345
PCT Pub. Date: Mar. 31, 2016

(65) Prior Publication Data
US 2017/0285460 A1     Oct. 5, 2017

(30) Foreign Application Priority Data
Sep. 25, 2014   (JP) .................................. 2014-195862

(51) Int. Cl.
*G03F 7/004*  (2006.01)
*G03F 1/50*   (2012.01)
(Continued)

(52) U.S. Cl.
CPC .............. *G03F 1/50* (2013.01); *C08F 220/16* (2013.01); *C08F 220/28* (2013.01); *G03F 1/24* (2013.01);
(Continued)

(58) Field of Classification Search
CPC ...... G03F 7/004; G03F 7/0045; G03F 7/0046; G03F 7/11; G03F 7/40; H01L 21/0274;
(Continued)

(56) References Cited

U.S. PATENT DOCUMENTS 5,583,063 A     12/1996  Samoto
9,245,751 B2*    1/2016  Su ............................. G03F 7/40
(Continued)

FOREIGN PATENT DOCUMENTS

JP     H05-249697 A     9/1993
JP     H07-153666 A     6/1995
(Continued)

OTHER PUBLICATIONS

Nov. 10, 2015 Search Report issued in International Patent Application No. PCT/JP2015/073892.

*Primary Examiner* — Amanda C. Walke
(74) *Attorney, Agent, or Firm* — Oliff PLC

(57) ABSTRACT

There is provided a mask blank including on a substrate: a thin film for forming a transfer pattern; a resist underlayer formed on the thin film and made of a resist underlayer composition containing a polymer having a unit structure having a lactone ring and a unit structure having a hydroxyl group; a resist film formed on the resist underlayer film and made of a resist composition; and a mixed film formed so as to be interposed between the resist underlayer film and the resist film and made of a mixed component containing the resist underlayer composition and the resist composition.

11 Claims, 4 Drawing Sheets

(51) Int. Cl.
*G03F 7/11* (2006.01)
*G03F 7/16* (2006.01)
*G03F 7/20* (2006.01)
*G03F 7/32* (2006.01)
*G03F 7/039* (2006.01)
*G03F 1/30* (2012.01)
*G03F 1/24* (2012.01)
*C08F 220/28* (2006.01)
*G03F 7/038* (2006.01)
*C08F 220/16* (2006.01)
*H01L 21/311* (2006.01)
*H01L 21/027* (2006.01)
*H01L 21/308* (2006.01)

(52) U.S. Cl.
CPC .............. *G03F 1/30* (2013.01); *G03F 7/0382* (2013.01); *G03F 7/0392* (2013.01); *G03F 7/11* (2013.01); *G03F 7/162* (2013.01); *G03F 7/168* (2013.01); *G03F 7/2004* (2013.01); *G03F 7/322* (2013.01); *H01L 21/0274* (2013.01); *H01L 21/3081* (2013.01); *H01L 21/31116* (2013.01); *C08F 2220/281* (2013.01)

(58) Field of Classification Search
CPC ........... H01L 21/3081; H01L 21/31116; C08F 220/16

USPC ......... 430/270.1, 271.1, 322, 325, 329, 330, 430/331; 526/320
See application file for complete search history.

(56) References Cited

U.S. PATENT DOCUMENTS

| | | | |
|---|---|---|---|
| 9,256,128 B2* | 2/2016 | Chang | C08F 220/18 |
| 9,436,086 B2* | 9/2016 | Su | G03F 7/40 |
| 9,460,909 B2* | 10/2016 | Chang | C08F 220/18 |
| 9,502,231 B2* | 11/2016 | Liu | H01L 21/0212 |
| 9,543,147 B2* | 1/2017 | Liu | H01L 21/0276 |
| 9,746,764 B2* | 8/2017 | Hiromatsu | G03F 1/50 |
| 2007/0190459 A1 | 8/2007 | Hashimoto et al. | |
| 2009/0047584 A1 | 2/2009 | Hashimoto | |
| 2016/0274457 A1 | 9/2016 | Hiromatsu et al. | |

FOREIGN PATENT DOCUMENTS

| | | |
|---|---|---|
| JP | 2007-171520 A | 7/2007 |
| JP | 2007-241259 A | 9/2007 |
| JP | 2015-094900 A | 5/2015 |
| JP | 2015-094901 A | 5/2015 |

* cited by examiner

MASK BLANK, METHOD FOR MANUFACTURING MASK BLANK AND TRANSFER MASK

TECHNICAL FIELD

The present invention relates to a mask blank, a method for manufacturing a mask blank and a method for manufacturing a transfer mask.

DESCRIPTION OF RELATED ART

Generally, in a manufacturing step of a semiconductor device, etc., a semiconductor pattern is formed using a photolithography method. A transfer mask is used in the pattern transfer step in carrying out this photolithography method. The transfer mask is the mask in which a predetermined transfer pattern is formed on a thin film (for example, a light-shielding film or hard mask film) provided on a substrate. The transfer pattern is formed by forming a resist film on the thin film, developing the resist film, and then patterning the thin film with the resist pattern obtained by development as a mask.

In recent years, miniaturization of the semiconductor pattern has progressed, and even the transfer pattern of the transfer mask used for forming the semiconductor pattern has been miniaturized. Therefore, in the mask blank, in order to form a resist film, a chemically amplified resist suitable for microfabrication technology is used. The chemically amplified resist generates an acid by exposure, and this acid reacts with a functional group or a functional substance that controls the solubility of a polymer as a catalyst to form a positive or negative resist film. Since the chemically amplified resist has high sensitivity and resolution by acid catalyst reaction, a fine resist pattern can be formed.

However, if the resist film made of the chemically amplified resist is formed immediately on the thin film, there is a problem that the resist film is deactivated. Specifically, the solubility of the resist film changes due to the acid catalysis reaction by exposure, but when the resist film is formed directly on the thin film, the acid catalyst reaction by exposure is inhibited. It can be considered that this is because if the surface of the thin film is made of a transition metal compound, the oxidized transition metal compound is exposed on the surface, and the oxide adsorbs a basic component or forms an underlayer component in some form. That is, the acid generated in the resist film at the time of exposure is deactivated because the reaction as a catalyst is inhibited by the basic component, or due to diffusion toward the thin film. This tendency occurs particularly strongly in the case of the thin film in which chromium is used as the transition metal. When the resist film is deactivated in this manner, the acid can not react sufficiently when exposing the resist film, resulting in poor resolution of the resist pattern when the resist film is developed.

Therefore, in order to suppress the deactivation of the resist film by the thin film, a method of providing a resist underlayer film between the thin film and the resist film has been proposed (for example, see patent documents 1 and 2). By interposing the resist underlayer between the thin film and the resist film, the reaction between the underlayer component contained in the thin film and the acid generated in the resist film is suppressed or the diffusion of the acid toward the thin film is suppressed. Whereby, the resolution of the resist pattern formed on the resist film can be improved. In addition, the resist underlayer film is made of an organic material, and therefore it is excellent in adhesion to the thin film and the resist film, so that adhesion of the resist film to the substrate can be secured.

PRIOR ART DOCUMENT

Patent Document

Patent document 1: Japanese Patent Laid Open Publication No. 2007-241259
Patent document 2: Japanese Patent Laid Open Publication No. 2007-171520

SUMMARY OF THE INVENTION

Problem to be Solved by the Invention

However, it is found that when the resist underlayer film is provided as in patent documents 1 and 2, the following problem occurs when the resist film is developed.

In the development of the resist film, the resist pattern is formed by removing a predetermined region of the resist film, but when a resist underlayer film is provided, the resist film is sometimes remained without being removed, in a region where the resist underlayer film is exposed, that is, in a space region of the resist pattern. After developing, the removed dropout of the resist film is washed out with a cleaning liquid. However, when the droplet of the cleaning liquid remains in the space region, the dropout is sometimes precipitated and reattached to the space region. Residue of the resist film and reattaching of the dropout occur due to high affinity between the components of the resist film and the components of the resist underlayer film and their high adhesion.

When such a residue (foreign matter) deriving from the resist film is present in the space region of the resist pattern, a defect due to the foreign matter is generated in the transfer pattern formed by etching when the thin film is etched using the resist pattern as a mask, resulting in reduction of a pattern accuracy of the transfer pattern.

Therefore, an object of the present invention is to provide the mask blank in which the foreign matter deriving from the resist film is hardly remained when developed and which has less foreign matter defects, and the transfer mask excellent in pattern accuracy.

Means for Solving the Problem (Aspect 1)
According to a first aspect of the present invention, there is provided a mask blank, including:
a substrate;
a thin film for forming a transfer pattern on the substrate;
a resist underlayer film provided on the thin film and made of
a resist underlayer composition containing a polymer having a unit structure having a lactone ring and a unit structure having a hydroxyl group;
a resist film provided on the resist underlayer film and made of a resist composition; and
a mixed film provided so as to be interposed between the resist underlayer film and the resist film and made of a mixed component containing the resist underlayer composition and the resist composition.
(Aspect 2)
According to a second aspect of the present invention, there is provided the mask blank of the first aspect, wherein the polymer further contains a unit structure having an aryl group or an arylalkyl group.

(Aspect 3)

According to a third aspect of the present invention, there is provided the mask blank of the first or second aspect, wherein the polymer is obtained by copolymerizing lactone (meth) acrylate and hydroxyalkyl (meth) acrylate.

(Aspect 4)

According to a fourth aspect of the present invention, there is provided the mask blank of any one of the first to third aspects, wherein the polymer is obtained by copolymerizing lactone (meth) acrylate, hydroxyalkyl (meth) acrylate and phenyl (meth) acrylate or benzyl (meth) acrylate.

(Aspect 5)

According to a fifth aspect of the present invention, there is provided the mask blank of any one of the first to fourth aspects, wherein the polymer is the polymer represented by formula (1) including a unit structure of formula (1-1) and a unit structure of formula (1-2), or the polymer represented by formula (2) including a unit structure of formula (2-1) and a unit structure of formula (2-2) and a unit structure of formula (2-3).

[Formula 1]

Formula (1)

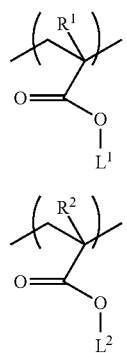

Formula (1-1)

Formula (1-2)

Formula (2)

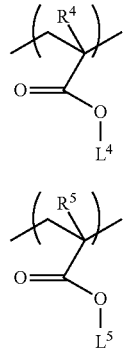

Formula (2-1)

Formula (2-2)

Formula (2-3)

[In the formula, $R^1$, $R^2$, $R^3$, $R^4$ and $R^5$ each represents a hydrogen atom or a methyl group, $L^2$ and $L^4$ each represents a hydroxyalkyl group having 1 to 10 carbon atoms, $L^5$ represents a phenyl group or a benzyl group, $L^1$ and $L^3$ each represents formula (L1-1) or formula (L1-2).]

[Formula 2]

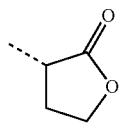

Formula (L1-1)

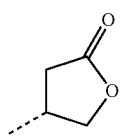

Formula (L1-2)

[In the formula, dotted line indicates a bond with the unit structure of the polymer.]

(Aspect 6)

According to a sixth aspect of the present invention, there is provided the mask blank of any one of the first to fifth aspects, wherein the resist underlayer composition further contains polynuclear phenol.

(Aspect 7)

According to a seventh aspect of the present invention, there is provided the mask blank of any one of the first to sixth aspects, wherein the polynuclear phenol is at least one of a compound represented by formula (b-1), a compound represented by formula (b-2), or a compound represented by formula (b-3).

[Formula 3]

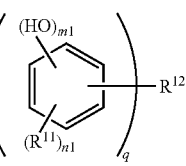

Formula (b-1)

(Wherein, in formula (b-1), each $R^{11}$ is a substituent of a hydrogen atom of a benzene ring, and is an organic group composed of a hydroxyl group, a halogen group, an alkyl group having 1 to 10 carbon atoms, an aryl group having 6 to 18 carbon atoms, an arylalkyl group having 7 to 25 carbon atoms, an alkylcarbonyl group having 2 to 10 carbon atoms, an alkylcarbonyloxy group having 2 to 10 carbon atoms, an alkylcarbonylamino group having 2 to 10 carbon atoms, an aryloxyalkyl group having 7 to 10 carbon atoms, an alkoxy group having 1 to 6 carbon atoms, or a combination thereof, and $R^{12}$ represents a single bond, or a divalent to tetravalent hydrocarbon group having 1 to 10 carbon atoms which may be substituted with halogen atoms, a divalent to tetravalent arylalkyl group having 7 to 25 carbon atoms which may be substituted with halogen atoms, or a sulfonyl group, m1 is an integer of 1 to 5, and n1 is an integer of $0 \leq n1 \leq 5-m1$, and q is an integer of 2 to 4).

[Formula 4]

Formula (b-2)

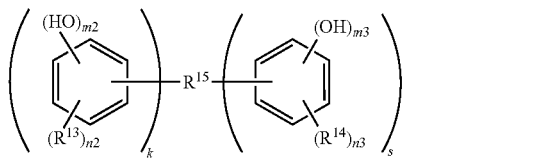

(Wherein, $R^{13}$ and $R^{14}$ in formula (b-2) are the same as $R^{11}$ in formula (b-1) respectively, and $R^{15}$ represents a single bond or a divalent to hexavalent hydrocarbon group having 1 to 10 carbon atoms which may be substituted with halogen atoms, a divalent to hexavalent arylalkyl group having 7 to 25 carbon atoms which may be substituted with halogen atoms, or a sulfonyl group, m2 and m3 is an integer of 1 to 5, n2 and n3 are integers of $0 \leq n2 \leq 5-m2$ and $0 \leq n3 \leq 5-m3$, and k and s each is an integer of 1 to 3.

[Formula 5]

Formula (b-3)

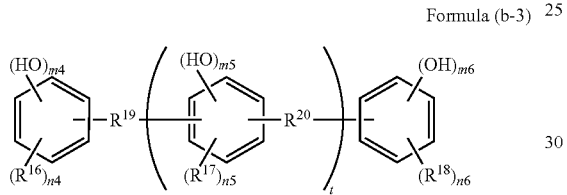

(Wherein, $R^{16}$, $R^{17}$, and $R^{18}$ in formula (b-3) are the same as $R^{11}$ in formula (b-1) respectively, and $R^{19}$ and $R^{20}$ represent a single bond or a divalent hydrocarbon group having 1 to 10 carbon atoms which may be substituted with halogen atoms, a divalent arylalkyl group having 7 to 25 carbon atoms which may be substituted with halogen atoms, or a sulfonyl group, m5 is an integer of 1 to 4, m4 and m6 are integers of 1 to 5 respectively, n5 is $0 \leq n5 \leq 4-m5$, n4 and n6 are integers of $0 \leq n4 \leq 5-m4$ and $0 \leq n6 \leq 5-m6$ respectively, and t is an integer of 1 to 4.

(Aspect 8)

According to an eighth aspect of the present invention, there is provided the mask blank of any one of the first to seventh aspects, wherein the resist underlayer composition further contains a crosslinking compound.

(Aspect 9)

According to a ninth aspect of the present invention, there is provided the mask blank of any one of the first to eighth aspects, wherein the resist underlayer composition further contains an acid compound.

(Aspect 10)

According to a tenth aspect of the present invention, there is provided a method for manufacturing a mask blank, including:

forming a thin film for forming a transfer pattern on a substrate;

forming a resist underlayer film on the thin film by applying a resist underlayer composition containing a polymer including a unit structure having a lactone ring and a unit structure having a hydroxyl group and heating the same; and forming a resist film by applying a resist composition on the resist underlayer film and heating the same, wherein in forming the resist film, a surface layer portion of the resist underlayer film is dissolved by applying the resist composition on the resist underlayer film, and a mixed component of a dissolved component of the resist underlayer film and the resist composition is formed on an interface between the resist underlayer film and the applied resist composition, and the resist film is formed by heating the mixed component together with the resist composition, and a mixed film is formed so as to be interposed between the resist underlayer film and the resist film.

(Aspect 11)

According to an eleventh aspect of the present invention, there is provided a method for manufacturing a transfer mask, including:

forming a resist pattern by exposing and developing the resist film and the mixed film of the mask blank manufactured by the method for manufacturing a mask blank of the tenth aspect; and forming a transfer pattern on the substrate by etching the resist underlayer film and the thin film using the resist pattern as a mask.

Advantage of the Invention

A mask blank in which a foreign matter deriving from a resist film is hardly remained when developed and which has less foreign matter defects, and a transfer mask excellent in pattern accuracy can be obtained.

DETAILED DESCRIPTION OF THE INVENTION

Figure 1:
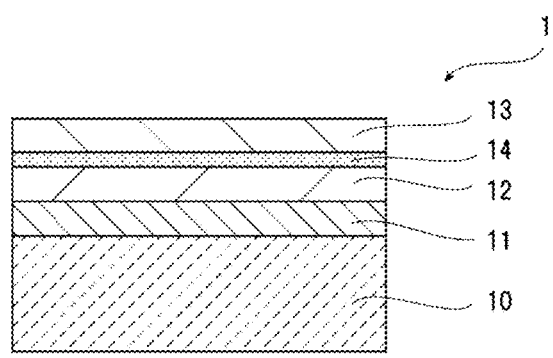
FIG. 1 is a schematic cross-sectional view of a mask blank according to an embodiment of the present invention.

In order to solve the abovementioned problems, inventors of the present invention have studied a method for suppressing a foreign matter defect generated when a mask blank is developed. As a result, it is found that the resist underlayer film should be formed so as to be soluble in the resist composition.

Generally, it is known that the resist underlayer film may be preferably hardly dissolved in the resist composition. This is because when the resist underlayer film is easily dissolved in the resist composition, the resist underlayer film is dissolved in the resist composition when the resist composition is applied on the resist underlayer film, and intermixing (mixture) of the dissolved component with the resist composition occurs. When the intermixing occurs, there is a possibility that characteristic (for example, resolution, etc.) of the obtained resist film is deteriorated.

However, according to intensive studies by the inventors of the present invention, it is found that from a viewpoint of suppressing a residue of a foreign matter deriving from the resist film, it is preferable that the resist underlayer film should be appropriately intermixed with the resist composition. According to the intermixing, a mixed component of a dissolved component of the resist underlayer film and the resist composition can be formed on an interface between the resist underlayer film and the applied resist composition. Then, when the resist composition is heated to form a resist film, a mixed film composed of the mixed components can be formed so as to be interposed between the resist underlayer film and the resist film, together with the resist film. That is, in the mask blank, the thin film, the resist underlayer film, the mixed film, and the resist film can be laminated on a substrate in this order.

Since this mixed film contains the components of the resist film, it exhibits the same solubility as the resist film in the developing solution by exposure. Further, since the mixed film contains a component of the resist underlayer film which is insoluble in the developing solution, it has a slower elution rate (developing speed) than the resist film in the developing solution. In the mask blank having such a mixed film, when a resist pattern is formed by developing the resist film, the resist film is eluted first, and then the mixed film is eluted in the developing solution. As a result thereof, even in a case where the resist film is not eluted and remains on the mixed film, or when the dropout of the resist film re-adheres onto the mixed film, the residue of the resist film is washed out by the elution of the mixed film located in the lower layer of the resist film. Accordingly, in the mask blank having the mixed film, when the resist film is developed, it is possible to suppress the foreign matter from remaining on the resist film, the foreign matter deriving from the residue of the resist film, and suppress a foreign matter defect in the resist pattern.

However, even if the resist underlayer film is formed so as to be soluble in the resist composition to form the mixed film and the foreign matter defect is suppressed, intermixing excessively occurs if the solubility of the resist underlayer film in the resist composition is too high, resulting in reduction of a resolution of the resist film. From this fact, it can be understood that in order to suppress both the foreign matter defect and the reduction of the resolution, it is preferable that the resist underlayer film is formed so as to be soluble in the resist composition but not to be excessively dissolved. Therefore, the inventors of the present invention have studied regarding a resist underlayer composition capable of forming such a resist underlayer film. As a result, it is found that a resist underlayer composition is preferable, containing a polymer having a unit structure having a lactone ring and a unit structure having a hydroxyl group. The present invention is made based on the abovementioned knowledge.

An embodiment of the present invention will be described hereafter, with reference to the drawings.

1. Mask Blank

The mask blank of this embodiment will be described using FIG. 1. FIG. 1 is a schematic cross-sectional view of the mask blank according to an embodiment of the present invention. In the following description, a binary mask blank which is a transmission type mask blank will be described as the mask blank.

As shown in FIG. 1, the mask blank 1 of this embodiment includes a thin film 11, a resist underlayer film 12, and a resist film 13 on a substrate 10, and a mixed film 14 is formed so as to be interposed between the resist underlayer film 12 and the resist film 13.

<Substrate>

As the substrate 10, in a case of a binary mask blank, a transparent substrate made of a material having translucency to exposure light, for example, made of a synthetic quartz glass is used.

<Thin Film>

The thin film 11 is provided for forming a transfer pattern. The thin film 11 is provided on the substrate 10. In a case of the binary mask blank, a light-shielding film is formed as the thin film 11. The light-shielding film is made of, for example, a material containing chromium (Cr), a material containing a transition metal and silicon (Si), or a material containing tantalum (Ta). As a material containing a transition metal and silicon (Si), a material containing at least one element of nitrogen, oxygen and carbon in the transition metal and silicon, can be mentioned other than the transition metal and silicon. Specifically, a material containing transition metal silicide, or nitride, oxide, carbide, oxynitride, carbonate, or carbonitride of transition metal silicide is suitable. As the transition metal, molybdenum, tantalum, tungsten, titanium, chromium, hafnium, nickel, vanadium, zirconium, ruthenium, rhodium, niobium or the like can be applied. Among them, molybdenum is particularly preferable. Note that the light-shielding film may be a single layer or a plurality of layers (for example, a laminated structure of a light-shielding layer and an antireflection layer). When the light-shielding film has a laminated structure of a light-shielding layer and an antireflection layer, the light-shielding layer may have a structure composed of a plurality of layers.

<Resist Underlayer Film>

The resist underlayer film 12 is provided on the thin film 11 and is a film for suppressing the deactivation of the resist film 13 by reducing an influence of a transition metal compound, particularly chromium oxide or the like contained in the thin film 11. As will be described in detail later, the resist underlayer film 12 is made of a resist underlayer composition containing a polymer having a unit structure having a lactone ring and a unit structure having a hydroxyl group. The resist underlayer film 12 made of a predetermined resist underlayer composition is soluble in the resist composition described later and is configured not to cause excessive intermixing.

The thickness of the resist underlayer film 12 is, for example, 1 nm or more and 50 nm or less, and preferably 5 nm or more and 30 nm or less, and more preferably 8 nm or more and 20 nm or less.

<Resist Film>

The resist film 13 has a predetermined pattern formed thereon by development, and used as a mask during patterning by etching the thin film 11. The resist film 13 is made of the resist composition.

As the resist composition, either negative type or positive type can be used. As the resist composition, for example, a chemically amplified resist composed of a binder having a group which is decomposed by an acid generator and acid to change an alkali dissolution rate, a chemically amplified resist composed of an alkali-soluble binder and a low molecular weight compound which is decomposed by the acid generator and acid to change the alkali dissolution rate, a chemically amplified resist composed of the binder having a group which is decomposed by the acid generator and acid to change the alkali dissolution rate and a low molecular weight compound which is decomposed by acid to change the alkali dissolution rate, a non-chemically amplified resist composed of a binder having a site cut by an electron beam to change the alkali dissolution rate, or the like can be used.
<Mixed Film>

The mixed film 14 is made of a mixed component including the resist underlayer composition forming the resist underlayer film 12 and the resist composition forming the resist film 13. When the resist composition is applied on the resist underlayer film 12, the mixed component is formed in such a way that a surface layer portion 12a of the resist underlayer film 12 is dissolved by the resist composition, and the dissolved component (resist underlayer composition) and the resist composition are intermixed (mixed). Such a mixture occurs on the interface between the resist underlayer film 12 and the applied resist composition, and therefore the mixed component is formed on the interface. Accordingly, the mixed film 14 formed by heating the mixed component is formed so as to be interposed between the resist underlayer film 12 and the resist film 13.

By forming the mixed film 14 between the resist underlayer film 12 and the resist film 13, the resist underlayer film 12 and the resist film 13 are integrally formed. That is, the resist film 13 is fixed on the resist underlayer film 12 via the mixed film 14. Therefore, high adhesion between the resist underlayer film 12 and the resist film 13 can be obtained.

The mixed film 14 contains a component of the resist underlayer film 12 (resist underlayer composition) which is hardly dissolved in a developing solution, and therefore is configured to lower an elution rate (developing speed) of the mixed film 14 in the developing solution as compared with the resist film 13.

Since the mixed film 14 contains the components of the resist film 13, it exhibits the same solubility as the solubility of the resist film 13 in the developing solution by exposure. For example, when the component of the resist film 13 is a positive resist, the mixed film 14 contains the component of the positive resist. The mixed film 14 exhibits the same solubility as the solubility of the positive resist in the developing solution, an unexposed region becomes insoluble in the developing solution, and an exposed region becomes soluble in the developing solution. When the component of the resist film 13 is a negative resist, the mixed film 14 contains the component of the negative resist, and therefore the unexposed region of the mixed film 14 becomes soluble in the developing solution and the exposed region becomes insoluble in the developing solution.

The mixed film 14 is formed so that its thickness becomes thin, because the resist underlayer film 12 is made of a polymer which does not dissolve excessively in the resist composition. In other words, the resist underlayer film 12 does not dissolve excessively when the resist composition is applied, and the mixed components are thinly formed on the interface, and therefore the thickness of the mixed film 14 becomes thin. The thickness of the mixed film 14 is preferably 0.1 nm or more and 10 nm or less, and more preferably 0.1 nm or more and 5 nm or less.
<Resist Underlayer Composition>

The resist underlayer composition for forming the resist underlayer film 12 is obtained by dissolving a polymer in a solvent, the polymer containing a unit structure having a lactone ring and a unit structure having a hydroxyl group. As required, the resist underlayer composition may further contain polynuclear phenol, a crosslinking compound, an acid compound as a crosslinking catalyst, an acid generator, other additives, and the like. The resist underlayer composition is configured to have a solid content of 0.01% by mass to 50% by mass, preferably 0.1% by mass to 20% by mass, and more preferably 0.1% by mass to 10% by mass. The solid content is obtained by removing the solvent component from the resist underlayer composition. Each component will be described below.
(Polymer)

The polymer includes a unit structure having a lactone ring and a unit structure having a hydroxyl group.

As the unit structure having a lactone ring, for example, a unit structure having a γ (gamma) butyrolactone ring having a five-membered ring structure or the unit structure having a δ (delta) valerolactone ring having a six-membered ring structure can be mentioned.

As the unit structure having a hydroxyl group, a hydroxyalkyl group is preferably mentioned. As this alkyl group, a linear or branched alkyl group having 1 to 10 carbon atoms can be mentioned. For example, straight-chain alkyl groups such as methyl, ethyl, n-propyl, n-butyl, branched alkyl groups such as isopropyl, isobutyl, 2-ethylhexyl, and alicyclic alkyl groups such as cyclopentyl and cyclohexyl, can be mentioned. As the hydroxyalkyl group, for example a hydroxymethyl group, a hydroxyethyl group, a hydroxymorpropyl group, a hydroxynorbutyl group, a hydroxyisopropyl group, a hydroxyisobutyl group, a hydroxy-2-ethylhexyl group, a hydroxycyclopentyl group, a hydroxycyclohexyl group and the like, can be mentioned.

The polymer preferably further contains the unit structure having an aryl group or an arylalkyl group. The aryl group is an aromatic group having 6 to 40 carbon atoms, and for example a phenyl group, a naphthyl group, and an anthryl group can be mentioned, and a heterocyclic aromatic group such as pyridyl, quinolinyl, and a quinoxalinyl group or the like can also be mentioned. The arylalkyl group is an organic group in which the aryl group and the alkyl group are bonded to each other, and for example a benzyl group and an ethylphenyl group can be mentioned.

The polymer containing the unit structure having a lactone ring and the unit structure having a hydroxyl group can be obtained, for example, by copolymerizing lactone (meth) acrylate and hydroxyalkyl (meth) acrylate. In addition, the polymer further containing the unit structure having an aryl group or an arylalkyl group can be obtained, for example, by copolymerizing lactone (meth) acrylate, hydroxyalkyl (meth) acrylate, and phenyl (meth) acrylate or benzyl (meth) acrylate.

As the polymer, the polymer of formula (1) including, for example, the unit structure of formula (1-1) and the unit structure of formula (1-2), or the polymer of formula (2) including, for example, the unit structure of formula (2-1), the unit structure of formula (2-2), and the unit structure of formula (2-3), can be mentioned. In the formulas (1) and (2), $R^1$, $R^2$, $R^3$, $R^4$ and $R^5$ each represents a hydrogen atom or a methyl group, $L^2$ and $L^4$ each represents a hydroxyalkyl group having 1 to 10 carbon atoms, and $L^5$ represents a phenyl group or a benzyl group. As the hydroxyalkyl group, the above exemplification can be mentioned. $L^1$ and $L^3$ each represents formula (L1-1) or formula (L1-2). In the formulas (L1-1) and (L1-2), a dotted line represents a chemical bond with the ester group represented by formula (1-1) and formula (2-1).

The molecular weight of the polymer varies depending on a coating solvent to be used, the viscosity of a solution, the shape of a film and the like, but it is 1000 to 1000000, preferably 1000 to 200000, and more preferably 1000 to 100000 as a weight average molecular weight.

γ-lactone used in the polymer is a lactone having a five-membered ring structure, and for example substituted and unsubstituted γ-lactones such as γ-butyrolactone and γ-valerolactone and the like can be mentioned. Also, δ-lactone is a lactone having a six-membered ring structure, and for example substituted or unsubstituted δ-lactone such as δ-valerolactone, δ-caprolactone and the like can be mentioned.

The unit structure of formula (1-1) and the unit structure of formula (2-1) used in the polymer of formula (1) and formula (2) can be produced by causing a reaction between, for example, acrylic monomer such as acrylic acid, halogenated acrylic acid, methacrylic acid, and lactone such as α-bromo-γ-butyrolactone, α-bromo-δ-valerolactone, and the like, and also can be produced by causing a reaction between acrylic polymer such as acrylic acid, halogenated acrylic acid, methacrylic acid and a lactone such as α-bromo-γ-butyrolactone, α-bromo-δ-valerolactone and the like.

The polymer of formula (2) used in the present invention can be a copolymer of γ-butyrolactone methacrylate, hydroxyethyl methacrylate, and benzyl methacrylate.

The polymer of formula (1) can contain the unit structure of formula (1-1) and the unit structure of formula (1-2) in a ratio of 5-45:25-60 mol %, based on a total unit structure contained in the polymer of formula (1).

The polymer of formula (2) can contain the unit structure of formula (2-1), the unit structure of formula (2-2), and the unit structure of formula (2-3) in a ratio of 5-45:25-60:10-45 mol %, based on the total unit structure contained in the polymer of formula (2).

The polymer of formula (1) or (2) is contained in an amount of 20% by mass or more, for example 20 to 100% by mass, or 30 to 100% by mass, or 50 to 99% by mass, or 60 to 98% by mass, or 80 to 98% by mass in a solid content of the resist underlayer composition.

The polymers of formulas (1) and (2) may be any one of random copolymers, block copolymers or graft copolymers. The polymer contained in the resist underlayer composition can be synthesized by methods such as radical polymerization, anionic polymerization, cationic polymerization and the like. Various methods such as solution polymerization, suspension polymerization, emulsion polymerization, bulk polymerization and the like are possible.

The polymer can further copolymerize a non-crosslinking monomer, whereby a dry etching rate, a reflectance and the like can be finely adjusted. Examples of such copolymerized monomers include the following. For example, a compound having one addition polymerizable unsaturated bond selected from acrylic acid esters, acrylamide, methacrylic acid esters, methacrylamides, allyl compounds, vinyl ethers, vinyl esters, styrenes, crotonic acid esters, and the like, can be mentioned.

As the acrylate esters, for example, alkyl acrylate having an alkyl group having 1 to 10 carbon atoms can be mentioned. As the methacrylic acid ester, for example, alkyl methacrylate having an alkyl group having 1 to 10 carbon atoms can be mentioned. As acrylamides, for example acrylamide, N-alkylacrylamide, N-arylacrylamide, N, N-dialkylacrylamide, N, N-diarylacrylamide, N-methyl-N-phenylacrylamide, N-2-acetamidoethyl-acetyl acrylamide and the like, can be mentioned. As the methacrylamides, for example, methacrylamide, N-alkylmethacrylamide, N-arylmethacrylamide, N, N-dialkylmethacrylamide, N, N-diarylmethacrylamide, N-methyl-N-phenylmethacrylamide, N-ethyl-N-phenylmethacrylamide and the like, can be mentioned. As the vinyl ethers, alkyl vinyl ether and vinyl aryl ether can be mentioned. As the vinyl esters, for example, vinyl butyrate, vinyl isobutyrate, vinyl trimethyl acetate can be mentioned. As the styrenes, for example, styrene, alkylstyrene, alkoxystyrene, halogenated styrene and carboxystyrene can be mentioned. As the crotonic acid esters, for example, alkyl crotonates such as butyl crotonate, hexyl crotonate, and glycerin monocrotonate can be mentioned. Further, dialkyl itaconates, dialkyl esters or monoalkyl esters of maleic acid or fumaric acid, crotonic acid, itaconic acid, maleic anhydride, acrylonitrile, methacrylonitrile, maleylonitrile and the like, can be mentioned.

(Crosslinking Compound)

The resist underlayer composition may contain a crosslinking compound as a crosslinking agent. By containing the crosslinking compound, it is possible to crosslink the polymer contained in the resist underlayer composition. As a result thereof, the resist underlayer film 12 can be sufficiently polymerized, and the ratio of the low molecular weight component which is easily dissolved in the resist composition can be reduced in the resist underlayer film 12. That is, the solubility of the resist underlayer film 12 in the resist composition is lowered, and excessive intermixing can be further suppressed. By crosslinking the resist underlayer film 12 in this manner, the mixed film 14 can be formed to have a small thickness of, for example, 10 nm or less, and preferably 5 nm or less.

As the crosslinking compound, for example, a melamine compound and a substituted urea compound having a crosslinking substituent such as a methylol group and a methoxymethyl group, a polymer compound containing an epoxy group, and the like can be mentioned. Preferably, it is a crosslinking compound having at least two crosslinking substituents and is a compound such as methoxymethylated glycouril or methoxymethylated melamine, and particularly preferably tetramethoxymethylglycoluril or hexamethoxymethylolmelamine. An addition amount of the crosslinking compound varies depending on the solvent to be used, the substrate 10 to be used, required solution viscosity, required film shape and the like, but is preferably from 0.001 to 40% by mass, or from 0 0.01 to 30% by mass, or 0.1 to 25% by mass, or 1 to 10% by mass. These crosslinking compounds sometimes undergo a self-condensation crosslinking reaction, but when a crosslinking forming substituent is present in the polymer used for the resist underlayer composition, a crosslinking reaction can be caused between the crosslinking compounds and the crosslinking forming substituents thereof.

(Polynuclear Phenol)

The resist underlayer composition may contain polynuclear phenol. Although polynuclear phenol may undergo the crosslinking reaction by self-condensation, it reacts with a crosslinking functional group (for example, hydroxyl group) in the polymer of formula (1) or formula (2) to form a three-dimensional crosslinked structure. Therefore, by containing polynuclear phenol, the solubility of the resist underlayer film 12 in the resist composition is lowered, and excessive intermixing can be further suppressed.

Polynuclear phenol has a phenol group, and its phenol group has at least one phenolic hydroxyl group. Polynuclear phenol is a compound having 2 to 30 phenolic hydroxyl groups, preferably 2 to 10 phenolic groups in the molecule. Polynuclear phenol may be composed of a moiety having a phenol group or may be composed of a combination of a moiety having a phenol group and a moiety other than the phenol group.

The amount of polynuclear phenol to be added varies depending on the solvent to be used, the substrate 10 to be used, the required solution viscosity, the required film shape and the like, but is preferably from 0.001 to 40% by mass, or 0.01 to 30% by mass, or 0.1 to 25% by mass, or 0.1 to 10% by mass based on a solid content.

As the polynuclear phenol, for example, at least one of the above-mentioned formulas (b-1), (b-2) or (b-3) can be used.

In the formula (b-1), each $R^{11}$ is a substituent of a hydrogen atom of a benzene ring, and an organic group composed of a hydroxy group, a halogen group, an alkyl group having 1 to 10 carbon atoms, an aryl group having 6 to 18 carbon atoms, an arylalkyl group having 7 to 25 carbon atoms, an alkylcarbonyl group having 2 to 10 carbon atoms, an alkylcarbonyloxy group having 2 to 10 carbon atoms, an alkylcarbonylamino group having 2 to 10 carbon atoms, an aryloxyalkyl group having 7 to 10 carbon atoms, an alkoxy group having 1 to 6 carbon atoms, or a combination thereof.

$R^{12}$ represents a single bond, a divalent to tetravalent hydrocarbon group having 1 to 10 carbon atoms which may be substituted with halogen atoms, a divalent to tetravalent arylalkyl group having 7 to 25 carbon atoms which may be substituted with halogen atoms, or a sulfonyl group, m is an integer of 1 to 5, and n1 is an integer of 0≤n1≤−m1, and q is an integer of 2 to 4.

As the halogen atom, a fluorine atom, a chlorine atom, a bromine atom and an iodine atom can be mentioned, and as the halogen group, a fluorine group, a chlorine group, a bromine group, and an iodine group can be mentioned.

As the alkyl group, a methyl group, an ethyl group, an n-propyl group, an i-propyl group, a cyclopropyl group, an n-butyl group, an i-butyl group, a s-butyl group, a t-butyl group, a cyclobutyl group, 1-methyl-cyclopropyl group, 2-methyl-cyclopropyl group, an n-pentyl group, 1-methyl-n-butyl group, 2-methyl-n-butyl group, 3-methyl-n-butyl group, 1,1-dimethyl-n-propyl group, 1,2-dimethyl-n-propyl group, 2,2-dimethyl-n-propyl group, 1-ethyl-n-propyl group, cyclopentyl group, 1-methyl-cyclobutyl group, 2-methyl-cyclobutyl group, 3-methyl-cyclobutyl group, 1,2-dimethyl-cyclopropyl group, 2,3-dimethyl-cyclopropyl group, 1-ethyl-cyclopropyl group, 2-ethyl-cyclopropyl group, n-hexyl group, 1-methyl-n-pentyl group, 2-methyl-n-pentyl group, A 3-methyl-n-pentyl group, a 4-methyl-n-pentyl group, 1,1-dimethyl-n-butyl group, 1,2-dimethyl-n-butyl group, 1,3-dimethyl-n-butyl group, 2,2-dimethyl-n-butyl group, 2,3-dimethyl-n-butyl group, 3,3-dimethyl-n-butyl group, 1-ethyl-n-butyl group, 2-ethyl-n-butyl group, 1,1,2-trimethyl-n-propyl group, 1,2,2-trimethyl-n-propyl group, 1-ethyl-1-methyl-n-propyl group, 1-ethyl-2-methyl-n-propyl group, cyclohexyl group, 1-methyl-cyclopentyl group, 2-methyl-cyclopentyl group, 3-methyl-cyclopentyl group, 1-ethyl-cyclobutyl group, 2-ethyl-cyclobutyl group, 3-ethyl-cyclobutyl group, 1,2-dimethyl-cyclobutyl group, 1,3-dimethyl-cyclobutyl group, 2,2-dimethyl-cyclobutyl group, 2,3-dimethyl-cyclobutyl group, 2,4-dimethyl-cyclobutyl group, 3,3-dimethyl-cyclobutyl group, 1-n-propyl-cyclopropyl group, 2-n-propyl-cyclopropyl group, 1-i-propyl-cyclopropyl group, 2-i-propyl-cyclopropyl group, 1,2,2-trimethyl-cyclopropyl group, 1,2,3-trimethyl-cyclopropyl group, 1,2,3-trimethyl-cyclopropyl group, 1-ethyl-2-methyl-cyclopropyl group, 2-ethyl-1-methyl-cyclopropyl group, 2-ethyl-2-methyl-cyclopropyl group, 2-ethyl-3-methyl-cyclopropyl group, and the like, can be mentioned. In particular, a linear alkyl group such as a methyl group or an ethyl group, a cyclohexyl group and the like are preferable.

The hydrocarbon group used for $R^{12}$, $R^{15}$, $R^{19}$ and $R^{20}$ is the organic group in which the alkyl group has a valence of 2, 2 to 4, or 2 to 6.

As the aryl group, phenyl group, o-methylphenyl group, m-methylphenyl group, p-methylphenyl group, o-chlorophenyl group, m-chlorophenyl group, p-chlorophenyl group, o-fluorophenyl group, O-methoxyphenyl group, p-methoxyphenyl group, p-nitrophenyl group, p-cyanophenyl group, α-naphthyl group, β-naphthyl group, o-biphenylyl group, m-biphenylyl group, p-biphenylyl group, Anthryl group, 2-anthryl group, 9-anthryl group, 1-phenanthryl group, 2-phenanthryl group, 3-phenanthryl group, 4-phenanthryl group, 9-phenanthryl group, and the like can be mentioned.

As the arylalkyl group, benzyl group, o-methylbenzyl group, m-methylbenzyl group, p-methylbenzyl group, o-chlorobenzyl group, m-chlorobenzyl group, p-chlorobenzyl group, o-fluorobenzyl group, p-fluorobenzyl group, O-methoxybenzyl group, p-methoxybenzyl group, p-nitrobenzyl group, p-cyanobenzyl group, phenethyl group, o-methylphenethyl group, m-methylphenethyl group, p-methylphenethyl group, o-chlorophenethyl, M-chlorophenethyl group, p-chlorophenethyl group, o-fluorophenethyl group, p-fluorophenethyl group, o-methoxyphenethyl group, p-methoxyphenethyl group, p-nitrophenethyl group, p-cyanophenethyl group, 3-phenylpropyl group, 4-phenylbutyl group, 5-phenylpentyl group, 6-phenylhexyl group, α-naphthylmethyl group, β-naphthylmethyl group, o-biphenylylmethyl group, m-biphenylylmethyl group, p-biphenylylmethyl group, 1-anthrylmethyl group, 2-anthrylmethyl group, 9-anthrylmethyl group, 1-phenanthrylmethyl group, 2-phenanthrylmethyl group, 3-phenanthrylmethyl group, 4-phenanthrylmethyl group, 9-phenanthrylmethyl group, α-naphthylethyl group, β-naphthylethyl group, o-biphenylylethyl group, m-biphenylylethyl group, p-biphenylylethyl group, 1-anthryl ethyl group, 2-anthryl ethyl group, 9-anthryl ethyl group, 1-phenanthryl ethyl group, 2-phenanthryl ethyl group, 3-phenanthryl ethyl group, 4-phenanthryl ethyl group, 9-phenanthryl ethyl group, and the like can be mentioned.

The arylalkyl group used for $R^{12}$, $R^{15}$, R19 and $R^{20}$ is the organic group in which the arylalkyl group has a valence of 2, 2 to 4, or 2 to 6.

As the alkylcarbonyl group, methylcarbonyl group, ethylcarbonyl group, n-propylcarbonyl group, i-propylcarbonyl group, cyclopropylcarbonyl group, n-butylcarbonyl group, i-butylcarbonyl group, s-butylcarbonyl group, t-butylcarbonyl group, cyclo Butylcarbonyl group, 1-methyl-cyclopropylcarbonyl group, 2-methyl-cyclopropylcarbonyl group, n-pentylcarbonyl group, 1-methyl-n-butylcarbonyl group, 2-methyl-n-butylcarbonyl group, 3-methyl-n-butylcarbonyl group, 1,1-dimethyl-n-propylcarbonyl group, 1,2-dimethyl-n-propylcarbonyl group, 2,2-dimethyl-n-propylcarbonyl group, 1-ethyl-n-propylcarbonyl group, cyclopentylcarbonyl group, A 1-methyl-cyclobutylcarbonyl group, a 2-methyl-cyclobutylcarbonyl group, a 3-methylcyclobutylcarbonyl group, a 1,2-dimethylcyclopropylcarbonyl group, a 2,3-dimethylcyclopropylcarbonyl group, a 1-ethyl-cyclopropylcarbonyl group, 2-ethyl-cyclopropylcarbonyl group, n-hexylcarbonyl group, 1-methyl-n-pentylcarbonyl group, 2-methyl-n-pentylcarbonyl group, 3-methyl-n-pentylcarbonyl group, 4-methyl-n-pentylcarbonyl group, 1,1-dimethyl-n-butylcarbonyl group, 1,2-dimethyl-n-butylcarbonyl group, 1,3-dimethyl-n-butylcarbonyl group, 2,2-dimethyl-n-butylcarbonyl group, 2,3-dimethyl-n-butylcarbonyl group, 3,3-dimethyl-n-butylcarbonyl group, 1-ethyl-n-butylcarbonyl group, 2-ethyl-n-butylcarbonyl group, 1,1,2-trimethyl-n-propylcarbonyl group, 1,2,2-trimethyl-n-propylcarbonyl group, 1-ethyl-1-methyl-n-propylcarbonyl group, 1-ethylpropylcarbonyl group, cyclohexylcarbonyl group, 1-methyl-cyclopentylcarbonyl group, 2-methyl-cyclopentylcarbonyl group, 3-methyl-cyclopentylcarbonyl group, 1-ethyl-cyclobutylcarbonyl group, 2-ethyl-cyclobutylcarbonyl group, 3-ethyl-cyclobutylcarbonyl group, 1,2-dimethylcyclobutylcarbonyl group, 1,3-dimethylcyclobutylcarbonyl group, 2,2-dimethyl-cyclobutylcarbonyl group, 2,3-dimethylcyclobutylcarbonyl group, 2,4-dimethylcyclobutylcarbonyl group, 3,3-dimethylcyclobutylcarbonyl group, 1-n-propyl-cyclopropylcarbonyl group, 2-n-propyl-cyclopropylcarbonyl group, 1-i-propyl-cyclopropylcarbonyl group, 2-i-propyl-cyclopropylcarbonyl group, 1,2,2-trimethyl-cyclopropylcarbonyl group, 1,2,3-trimethyl-cyclopropylcarbonyl group, 2,3-trimethyl-cyclopropylcarbonyl group, 1-ethyl-2-methyl-cyclopropylcarbonyl group, 2-ethyl-1-methyl-cyclopropylcarbonyl group, 2-ethyl-2-methyl-cyclopropylcarbonyl group, 2-ethyl-3-methyl-cyclopropylcarbonyl group, and the like can be mentioned.

As the alkylcarbonyloxy group, methylcarbonyloxy group, ethylcarbonyloxy group, n-propylcarbonyloxy group, i-propylcarbonyloxy group, cyclopropylcarbonyloxy group, n-butylcarbonyloxy group, i-butylcarbonyloxy group, s-butylcarbonyloxy group, t-butylcarbonyloxy group, cyclobutylcarbonyloxy group, 1-methyl-cyclopropylcarbonyloxy group, 2-methyl-cyclopropylcarbonyloxy group, n-pentylcarbonyloxy group, 1-methyl-n-butylcarbonyloxy methyl-n-butylcarbonyloxy group, 3-methyl-n-butylcarbonyloxy group, 1,1-dimethyl-n-propylcarbonyloxy group, 1,2-dimethyl-n-propylcarbonyloxy group, 2-methyl-n-propylcarbonyloxy group, a 1-ethyl-n-propylcarbonyloxy group, a cyclopentylcarbonyloxy group, a 1-methylcyclobutylcarbonyloxy group, a 2-methylcyclobutylcarbonyloxy group, 3-methyl-cyclobutylcarbonyloxy group, 1,2-dimethyl-cyclopropylcarbonyloxy group, 2,3-dimethyl-cyclopropylcarbonyloxy group, 1-ethyl-cyclopropylcarbonyloxy group, 2-ethyl-cyclopropylcarbonyl, an oxy group, an n-hexylcarbonyloxy group, 1-methyl-n-pentylcarbonyloxy group, 3-methyl-n-pentylcarbonyloxy group, 4-methyl-n-pentylcarbonyloxy group, 1,1-dimethyl-N-butylcarbonyloxy group, 1,2-dimethyl-n-butylcarbonyloxy group, 1,3-dimethyl-n-butylcarbonyloxy group, 2,2-dimethyl-n-butylcarbonyloxy group, Dimethyl-n-butylcarbonyloxy group, 3,3-dimethyl-n-butylcarbonyloxy group, 1-ethyl-n-butylcarbonyloxy group, 2-ethyl-n-butylcarbonyloxy group, 1,2,2-trimethyl-n-propylcarbonyloxy group, 1-ethyl-1-methyl-n-propylcarbonyloxy group, 1-ethyl-2-methyl-n-propylcarbonyloxy group, cyclohexylcarbonyloxy group, 1-methyl-cyclopentylcarbonyloxy group, 2-methyl-cyclopentylcarbonyloxy group, 3-methyl-cyclopentylcarbonyloxy group, 1-ethyl-cyclobutylcarbonyloxy group, 2-ethyl-cyclobutylcarbonyloxy group, 3-ethyl A cyclobutylcarbonyloxy group, 1,2-dimethyl-cyclobutylcarbonyloxy group, 1,3-dimethyl-cyclobutylcarbonyloxy group, 2,2-dimethyl-cyclobutylcarbonyloxy group, 2,3-dimethylcyclobutylcarbonyloxy group, 2,4-dimethylcyclobutylcarbonyloxy group, 3, 3-dimethyl-cyclobutylcarbonyloxy group, 1-n-propyl-cyclopropylcarbonyloxy group, 2-n-propyl-cyclopropylcarbonyloxy group, 1-i-propyl-cyclopropylcarbonyloxy group, 2-i-propyl-cyclopropylcarbonyloxy group, 1,2,2-trimethylcyclopropylcarbonyloxy group, 1,2,3-trimethyl-cyclopropylcarbonyloxy group, 2,2,3-trimethyl-cyclopropylcarbonyloxy group, 1-ethyl-2-methyl-cyclopropylcarbonyloxy group, 2-ethyl-1-methyl-cyclopropylcarbonyloxy group, 2-ethyl-2-methyl-cyclopropylcarbonyloxy group, 2-ethyl-3-methyl-cyclopropylcarbonyloxy group, and the like can be mentioned.

As the alkylcarbonylamino group, methylcarbonylamino group, ethylcarbonylamino group, n-propylcarbonylamino group, i-propylcarbonylamino group, cyclopropylcarbonylamino group, n-butylcarbonylamino group, i-butylcarbonylamino group, s-butylcarbonylamino group, t-butylcarbonylamino group, cyclobutylcarbonylamino group, 1-methyl-cyclopropylcarbonylamino group, 2-methyl-cyclopropylcarbonylamino group, n-pentylcarbonylamino group, 1-methyl-n-butylcarbonylamino group, 2-methyl-n-butylcarbonylamino group, 3-methyl-n-butylcarbonylamino group, 1,1-dimethyl-n-propylcarbonylamino group, 1,2-dimethyl-n-propylcarbonylamino group, and the like can be mentioned.

As the aryloxyalkyl group, phenyloxymethyl group, o-methylphenyloxyethyl group, m-methylphenyloxymethyl group, p-methylphenyloxypropyl group, o-chlorophenyloxymethyl group, m-chlorophenyloxyethyl group, p-chlorophenyloxy Isopropyl group, o-fluorophenyloxyethyl group, p-fluorophenyloxybutoxy group, o-methoxyphenyloxy-n-pentyl group, p-methoxyphenyloxy-t-butyl group, p-nitrophenyloxymethyl group, p-cyanophenyloxy-s-butyl group, α-naphthyloxymethyl group, β-naphthyloxyethyl group, o-biphenylyloxymethyl group, m-biphenylyloxymethyl group, p-biphenylyloxymethyl group, 1-anthryloxymethyl group, 2-anthryloxymethyl group, 9-anthryloxymethyl group, 1-phenanthryloxymethyl group, 2-phenanthryloxymethyl group, 3-phenanthryloxymethyl group, 4-phenanthryloxymethyl group, 9-phenanthryloxymethyl group, can be mentioned.

As the alkoxy group, methoxy group, ethoxy group, n-propoxy group, i-propoxy group, n-butoxy group, i-butoxy group, s-butoxy group, t-butoxy group, n-pentoxy group, Methyl-n-butoxy group, 3-methyl-n-butoxy group, 1,1-dimethyl-n-propoxy group, 1,2-dimethyl-n-propoxy group, 2,2-dimethyl-propoxy group, 1-ethyl-n-propoxy group, n-hexyloxy group, 1-methyl-n-pentyloxy group, 2-methyl-n-pentyloxy group, 3-methyl-n-pentyloxy group, 4-methyl-n-pentyloxy group, 1,1-dimethyl-n-butoxy group, 1,2-dimethyl-n-butoxy group, 1,3-dimethyl-n-butoxy group, 2,2-butoxy group, a 2,3-dimethyl-n-butoxy group, 3,3-dimethyl-n-butoxy group, 1-ethyl-n-butoxy group, 2-ethyl-n-butoxy group, 1,1,2-trimethyl-n-propoxy group, 1,2,2-trimethyl-n-propoxy group, 1-ethyl-1-methyl-n-propoxy group, 1-ethyl-2-methyl-n-propoxy group and the like, can be mentioned.

As the compound of formula (b-1), the following are exemplified.

[Formula 6]

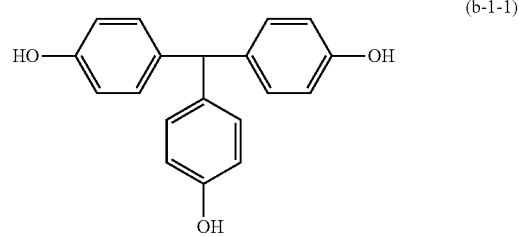

(b-1-1)

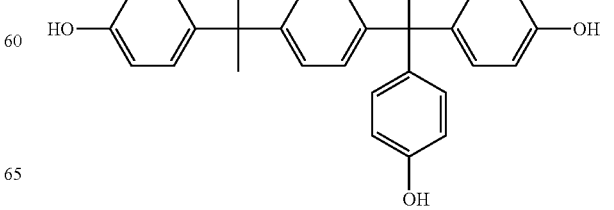

(b-1-2)

(b-1-3)
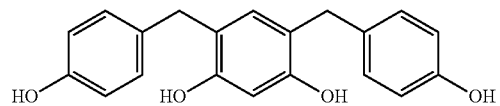
(b-1-4)
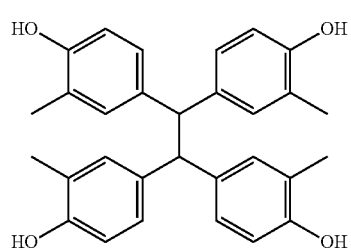
(b-1-5)
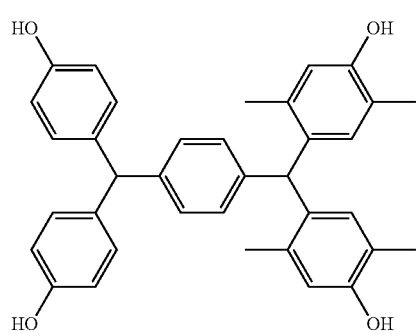
(b-1-6)
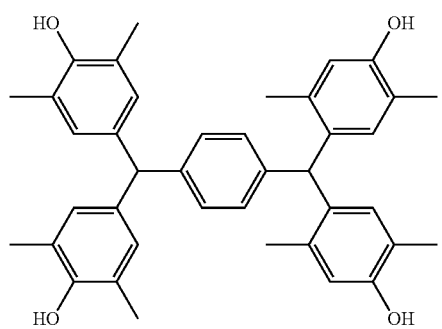
(b-1-7)
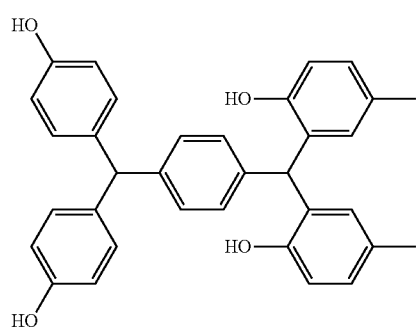
(b-1-8)
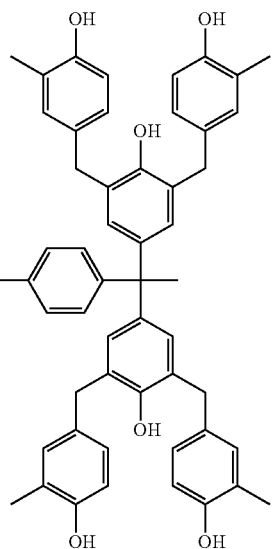
[Formula 7]
(b-1-9)
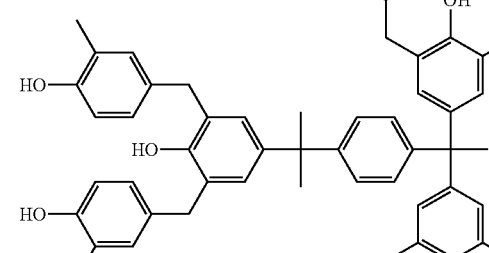
(b-1-10)
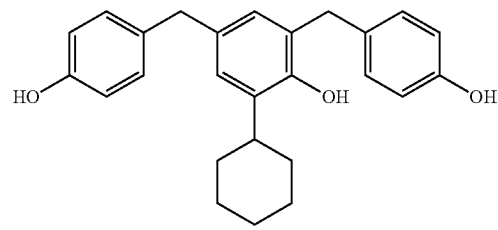
(b-1-11)
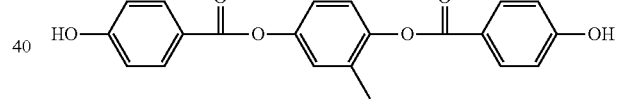
(b-1-12)
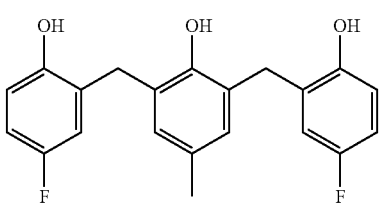
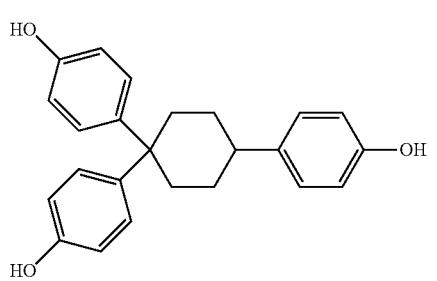

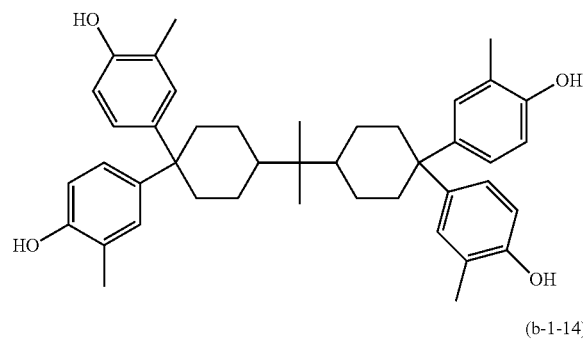
(b-1-13)

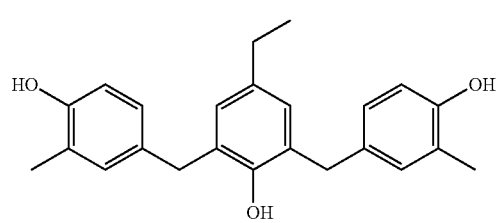
(b-1-14)

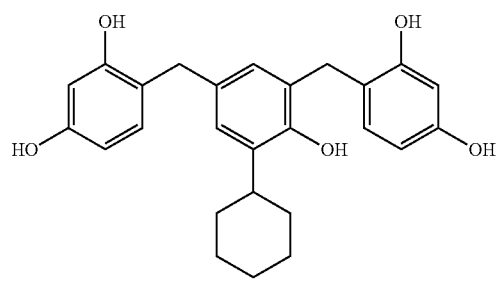
(b-1-15)

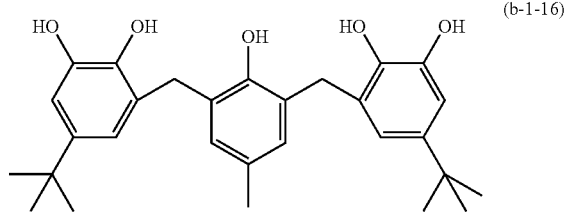
(b-1-16)

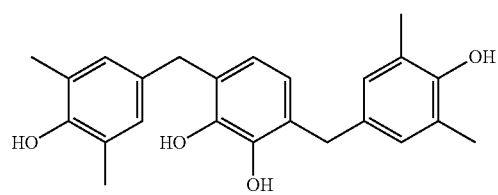
(b-1-17)

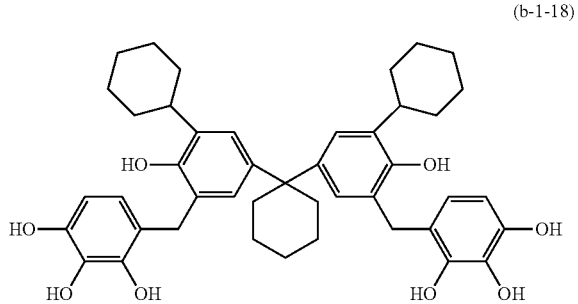
(b-1-18)

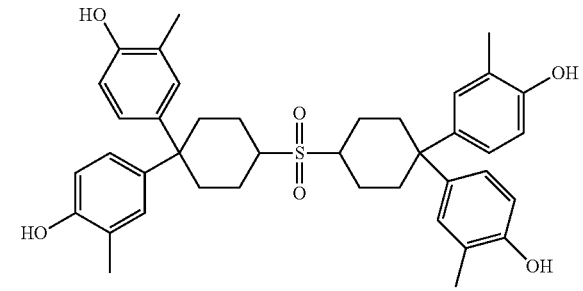
(b-1-19)

$R^{13}$ and $R^{14}$ in formula (b-2) are the same as $R^{11}$ in formula (b-1) respectively, $R^{15}$ represents a single bond, or a divalent to hexavalent hydrocarbon group having 1 to 10 carbon atoms which may be substituted with halogen atoms, a divalent to hexavalent arylalkyl group having 7 to 25 carbon atoms which may be substituted with halogen atoms, or a sulfonyl group, m2 and m3 are respectively integers of 1 to 5, and n2 and n3 are integers of $0 \leq n2 \leq 5-m2$, $0 \leq n3 \leq 5-m3$, k and s represent integers of 1 to 3 respectively.

As the compound of formula (b-2), for example, the following compounds are exemplified.

[Formula 8]

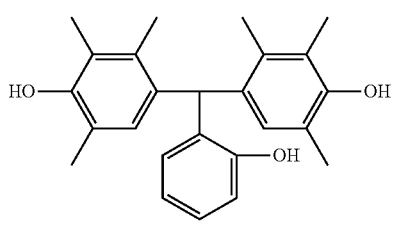
(b-2-1)

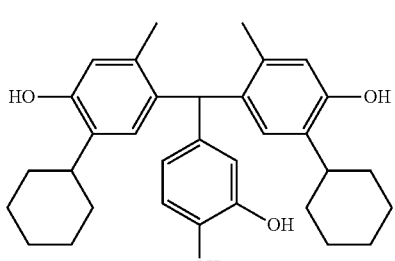
(b-2-2)

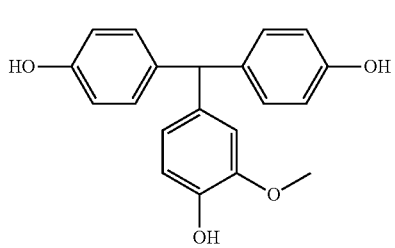
(b-2-3)

-continued
(b-2-4)
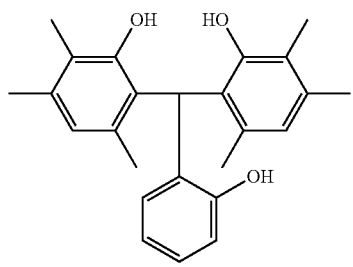
(b-2-5)
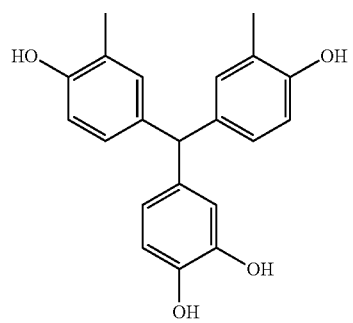
(b-2-6)
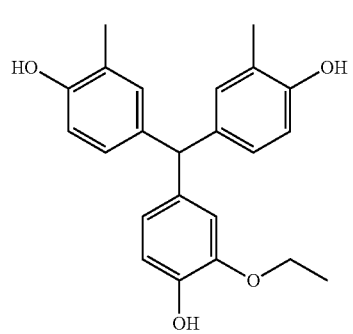
(b-2-7)
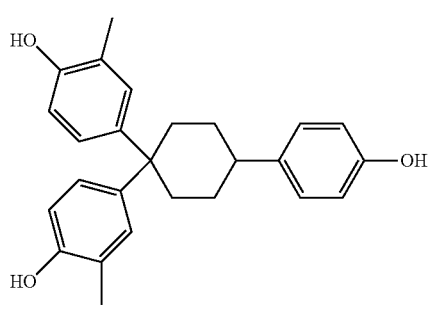
(b-2-8)
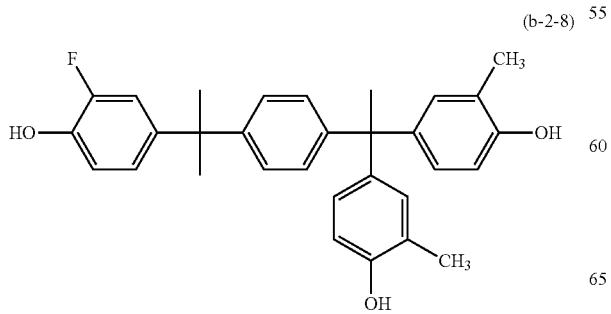
(b-2-9)
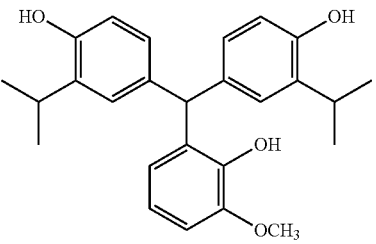
(b-2-10)
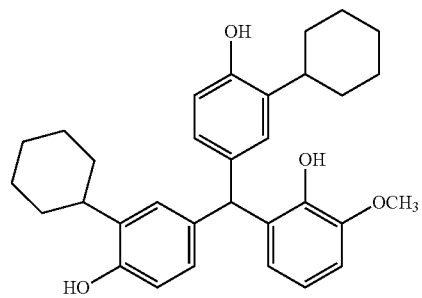
(b-2-11)
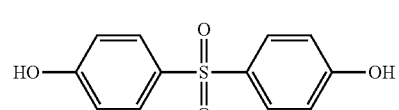
(b-2-12)
(b-2-13)
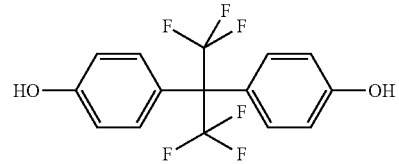
(b-2-14)
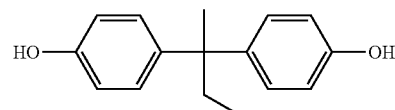
(b-2-15)
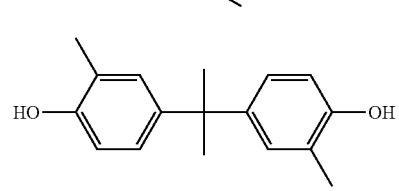
(b-2-16)
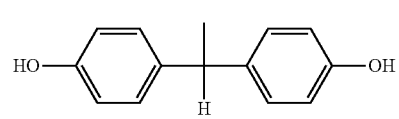
(b-2-17)
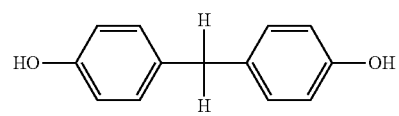

(b-2-18)

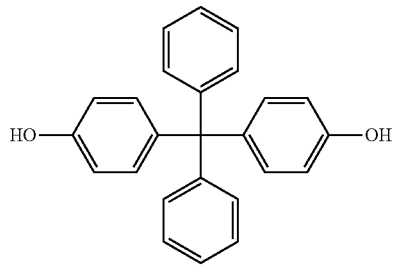

(b-3-5)

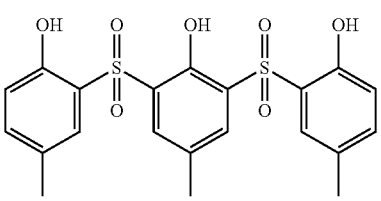

As the polynuclear phenol, the following cyclic compounds can also be used.

[Formula 11]

(b-3-6)

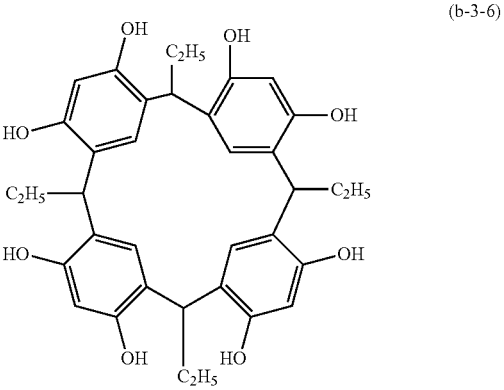

$R^{16}$, $R^{17}$ and $R^{18}$ in formula (b-3) are the same as $R^{11}$ in formula (b-1) respectively. $R^{19}$ and $R^{20}$ represent a single bond respectively, or a divalent hydrocarbon group having 1 to 10 carbon atoms which may be substituted with halogen atoms, a divalent arylalkyl group having 7 to 25 carbon atoms which may be substituted with halogen atoms, or a sulfonyl group, m5 is an integer of 1 to 4, m4 and m6 are integers of 1 to 5, n5 is an integer of 0≤n5≤4−m5, n4 and n6 are respectively integers of 0≤n4≤5−m4, 0≤n6≤5−m6, and t is an integer of 1 to 4.

As the compound of formula (b-3), for example, the following compounds are exemplified.

[Formula 10]

(b-3-1)

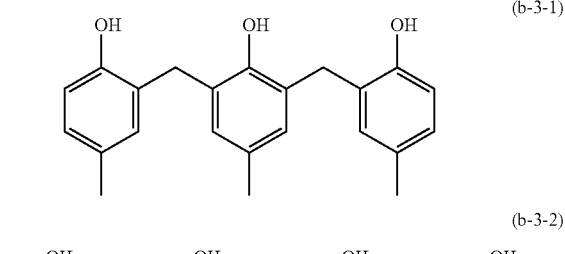

(b-3-7)

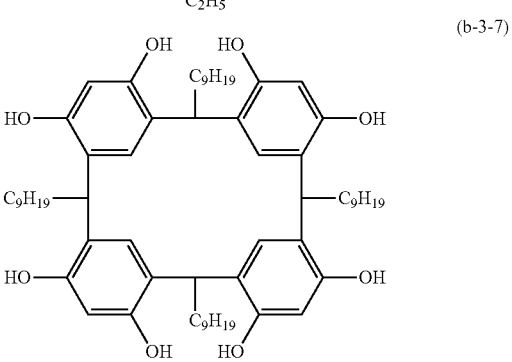

(b-3-2)

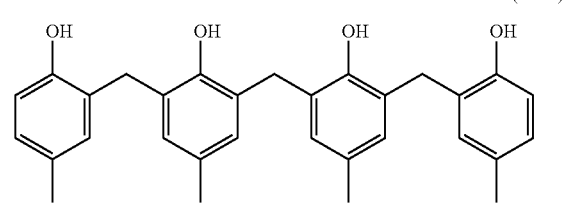

(b-3-3)

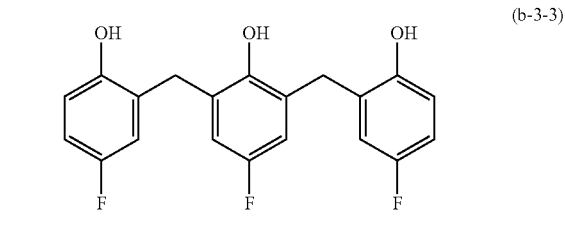

The polynuclear phenol of formula (b-2) is preferable, and for example, bisphenol S represented by formula (b-2-11) can be preferably exemplified.

(Acid Compound)

The resist underlayer composition may contain an acid compound as a catalyst for promoting the crosslinking reaction. As the acid compound, an acidic compound such as p-toluenesulfonic acid, trifluoromethanesulfonic acid, pyridinium p-toluenesulfonic acid, salicylic acid, sulfosalicylic acid, citric acid, benzoic acid, hydroxybenzoic acid and/or a thermal acid generator such as 2,4,4,6-tetrabromocyclohexadienone, benzoin tosylate, and 2-nitrobenzyl tosylate and the like can be used. A blending amount of the acid compound is 0.02 to 10% by mass, and preferably 0.04 to 5% by mass per solid content.

(Acid Generator)

In order to make an acidity of the resist underlayer composition coincide with that of the resist film 13 applied on an upper layer in the lithography step, an acid generator that generates acid by electron beam irradiation is preferably contained in the resist underlayer composition. As a preferable acid generator, for example, onium salt type acid (b-3-4)

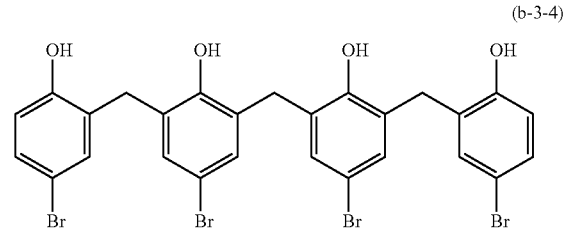

generators such as bis (4-tert-butylphenyl) iodonium trifluoromethanesulfonate and triphenylsulfonium trifluoromethanesulfonate, halogen-containing compound acid generators such as phenyl-bis (trichloromethyl)-s-triazine, and sulfonic acid type acid generators such as benzoin tosylate and N-hydroxysuccinimide trifluoromethanesulfonate, can be mentioned. The addition amount of the acid generator is 0.02 to 3% by mass, and preferably 0.04 to 2% by mass, per solid content.

(Solvent)

The solvent is not limited as long as it can dissolve the polymer and form the resist underlayer composition. As the solvent, for example, ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, 2-hydroxy Methyl 3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, and the like can be used. These organic solvents are used singly or in combination of two or more kinds.

Further, propylene glycol monobutyl ether, and propylene glycol monobutyl ether acetate can be used by mixing them. Of these solvents, propylene glycol monomethyl ether, propylene glycol monomethyl ether acetate, ethyl lactate, butyl lactate, and cyclohexanone are preferable for improving a leveling property.

(Other Additive)

The resist underlayer composition may contain a rheology control agent, an adhesion aid, a surfactant, and the like as other additive.

The rheology control agent is mainly added for the purpose of improving the fluidity of the resist underlayer composition and enhancing the filling property of the resist underlayer composition into a hole of the substrate 10, particularly in the heating (baking) step. As specific examples, phthalic acid derivatives such as dimethyl phthalate, diethyl phthalate, diisobutyl phthalate, dihexyl phthalate and butyl isodecyl phthalate and the like, adipic acid derivatives such as di-normal butyl adipate, diisobutyl adipate, diisooctyl adipate, octyl decyl adipate and the like, maleic acid derivatives such as di-normal butyl malate, diethyl maleate and dinonyl maleate and the like, oleic acid derivatives such as methyl oleate, butyl oleate, tetrahydrofurfuryl oleate and the like, or stearic acid derivatives such as normal butyl stearate and glyceryl stearate and the like, can be mentioned. The blending amount of the rheology control agent is preferably less than 30% by mass based on the total composition of the resist underlayer composition.

The adhesion aid is mainly added for the purpose of improving the adhesion between the resist underlayer film 12 and the substrate 10 or the resist film 13, particularly for preventing the resist film 13 from peeling during development. Specifically, chlorosilanes such as trimethylchlorosilane, dimethylvinylchlorosilane, methyldiphenylchlorosilane, chloromethyldimethylchlorosilane and the like, alkoxysilanes such as trimethylmethoxysilane, dimethyldiethoxysilane, methyldimethoxysilane, dimethylvinylethoxysilane, diphenyldimethoxysilane, phenyltriethoxysilane and the like, silazanes such as hexamethyldisilazane, N, N'-bis (trimethylsilyl) urea, dimethyltrimethylsilylamine, trimethylsilylimidazole and the like, silanes such as vinyltrichlorosilane, γ-chloropropyltrimethoxysilane, γ-aminopropyltriethoxysilane, γ-glycidoxypropyltrimethoxysilane and the like, heterocyclic compounds such as benzotriazole, benzimidazole, indazole, imidazole, 2-mercaptobenzimidazole, 2-mercaptobenzothiazole, 2-mercaptobenzoxazole, urazole, thiouracil, mercaptoimidazole, mercaptopyrimidine and the like, urea such as 1,1-dimethyl urea and 1,3-dimethylurea, or thiourea compound, can be mentioned. The blending amount of the adhesion aid is less than 5% by mass, and preferably less than 2% by mass, based on the total composition of the resist underlayer composition.

In the resist underlayer composition, there is no occurrence of pinholes, strains and the like, and a surfactant is preferably contained in order to further improve a coating property against surface unevenness. As the surfactant, for example, nonionic surfactants such as polyoxyethylene alkyl ethers such as polyoxyethylene lauryl ether, polyoxyethylene stearyl ether, polyoxyethylene cetyl ether and polyoxyethylene oleyl ether, polyoxyethylene alkyl allyl ethers such as polyoxyethylene octyl phenol ether and polyoxyethylene nonyl phenol ether, polyoxyethylene-polyoxypropylene block copolymers, sorbitan fatty acid esters such as sorbitan monolaurate, sorbitan monopalmitate, sorbitan monostearate, sorbitan monooleate, sorbitan trioleate and sorbitan tristearate, polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate and the like, fluorine-based surfactants such as Eftop EF 301, EF 303, EF 352 (manufactured by Tochem Products Co., Ltd., Megafuacs F171, F173 (manufactured by Dainippon Ink & Chemicals, Inc.), Fluorad FC 430, FC 431 (manufactured by Sumitomo 3M Ltd.), Asahi Guard AG 710, Surflon S-382, SC 101, SC 102, SC 103, SC 104, SC 105, SC 106 (manufactured by Asahi Glass Co., Ltd.), and Organosiloxane polymer KP 341 (manufactured by Shin-Etsu Chemical Co., Ltd.) and the like can be mentioned. The amount of these surfactants is usually 0.2 mass % or less, and preferably 0.1 mass % or less, based on the total composition of the resist underlayer composition. These surfactants may be added singly or in combination of two or more.

2. Method for Manufacturing a Mask Blank

Figure 2A:
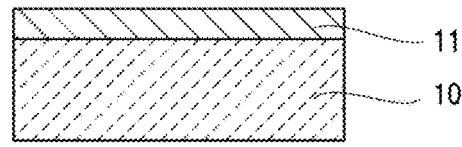
FIG. 2 (a) to FIG. 2 (e) are cross-sectional views showing the manufacturing steps of the mask blank according to an embodiment of the present invention.

The abovementioned method for manufacturing a mask blank will be described next, with reference to FIG. 2(a) to FIG. 2(E). FIG. 2(a) to FIG. 2 (e) are cross-sectional views showing the manufacturing steps of the mask blank according to an embodiment of the present invention.

(Thin Film Forming Step)

First, as shown in FIG. 2(a), the thin film 11 for the transfer pattern 30 to be formed thereon is formed on the substrate 10 by, for example, a sputtering method.

(Resist Underlayer Film Forming Step)

Figure 2B:
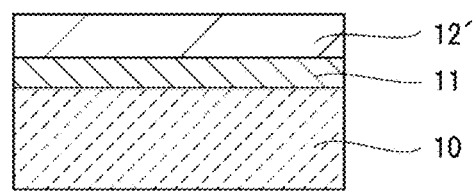

Next, as shown in FIG. 2(b), a resist underlayer composition 12' containing the polymer having the unit structure having a lactone ring and the unit structure having a hydroxyl group is applied on the thin film 11 by spin coating for example.

Figure 2C:
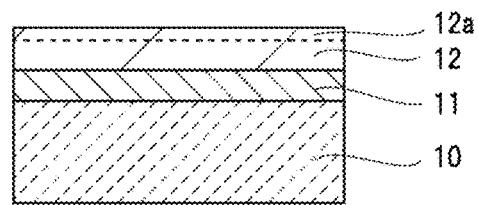

Subsequently, as shown in FIG. 2(c), the resist underlayer film 12 is formed by heating the resist underlayer composition 12'. Specifically, the solvent contained in the resist underlayer composition is volatilized by heating, and the resist underlying film 12 is formed by crosslinking the polymer. The resist underlayer film 12 is configured to be soluble in the resist composition 13' and not to allow excessive intermixing to occur, because it is made of the polymer containing the unit structure having a lactone ring and the unit structure having a hydroxyl group.

In this embodiment, from a viewpoint of constituting the resist underlayer film 12 so that it is soluble in the resist composition 13' and is moderately intermixed with the resist composition 13', the resist underlayer composition 12' is preferably gently heated by raising the temperature from a low temperature to a high temperature, when heating the resist base composition 12'. Specifically, the resist underlayer composition 12' is preferably heated gently by raising the temperature from a temperature lower than a boiling point of the solvent contained in the resist underlayer composition 12' (for example, room temperature 23° C.) to a temperature higher than a crosslinking start temperature at which crosslinking of the resist underlayer composition 12' starts. From a viewpoint of gentle heating, the rate of temperature rise is preferably 80° C./min or less, and more preferably 50° C./min or less.

(Resist Film Forming Step)

Figure 2D:
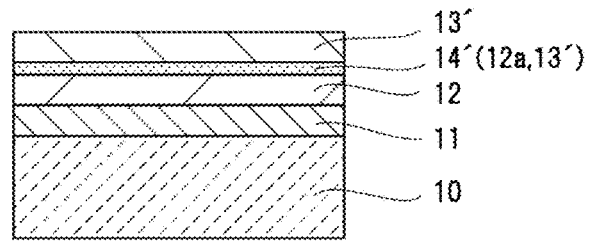

Subsequently, as shown in FIG. 2(d), the resist composition 13' is applied on the resist underlayer film 12 by, for example, spin coating. Since the resist underlayer film 12 is made soluble in the resist composition 13', the surface layer portion 12a of the resist underlayer film 12 is dissolved in the resist composition 13'. As a result thereof, a mixed component 14' is formed on the interface between the resist underlayer film 12 and the resist composition 13', in which the component resulting from the dissolving of the surface layer portion 12a of the resist underlayer 12 and the resist composition 13' are mixed.

Figure 2E:
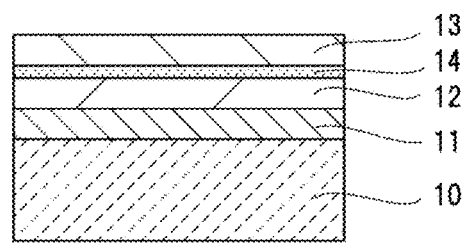

Subsequently, as shown in FIG. 2(e), the resist composition 13' is heated to form the resist film 13. At this time, the mixed component 14' is simultaneously heated and crosslinked to thereby form the mixed layer 14. By forming the mixed film 14 between the resist underlayer film 12 and the resist film 13, the resist film 13 is integrally formed with the resist underlayer film 12.

As described above, the mask blank 1 of this embodiment is obtained.

3. Transfer Mask and a Method for Manufacturing the Same

A transfer mask 100 of this embodiment and a method for manufacturing the same will be described next, with reference to FIG. 3(a) to FIG. 3(d). FIG. 3(a) to FIG. 3(d) are cross-sectional views showing the manufacturing steps of the transfer mask 100 according to an embodiment of the present invention. In the following description, a case where the resist film 13 contains a positive resist component will be described.

(Exposure Step)

Figure 3A:
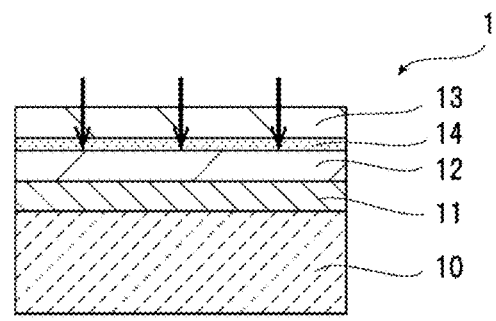
FIG. 3 (a) to FIG. 3 (d) are cross-sectional views showing the manufacturing steps of a transfer mask according to an embodiment of the present invention.

First, as shown in FIG. 3(a), the resist film 13 and the mixed film 14 of the mask blank 1 are exposed so as to correspond to a predetermined transfer pattern 30. In the resist film 13, an exposed region becomes soluble in the developing solution, and an unexposed region becomes insoluble in the developing solution. Similarly, in the mixed film 14 containing the components of the resist film 13, the exposed region becomes soluble in the developing solution, and the unexposed region becomes insoluble in the developing solution.

(Developing Step)

Figure 3B:
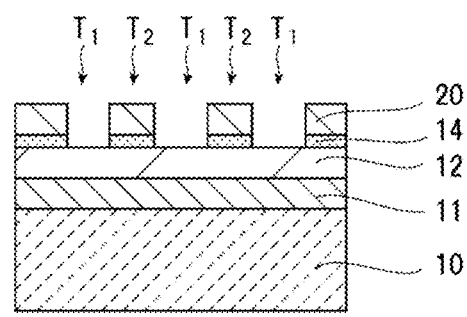

Subsequently, the resist film 13 is developed using a predetermined developing solution. By the development, as shown in FIG. 3(b), the exposed region of the resist film 13 is eluted and removed, and the unexposed region of the resist film 13 remains without elution. As a result thereof, a resist pattern 20 is formed. In the resist pattern 20, a region from which the resist film 13 is removed becomes a space region $T_1$, and a region where the resist film 13 remains becomes a line region $T_2$. In the developing step, the mixed film 14 is also developed in the same manner as the resist film 13. That is, the space region $T_1$ of the mixed film 14 is removed, and the line region $T_2$ of the mixed film 14 remains without being removed.

In the developing step, first, the resist film 13 is eluted into the developing solution. Subsequently, the resist underlayer film 12, which is located under the resist film 13 and has a slow elution rate in the developing solution as compared with the resist film 13, is eluted into the developing solution. Therefore, even in a case where the resist film 13 does not dissolve in the space region $T_1$ and remains on the mixed film 14 or when the dropout of the resist film 13 re-adheres onto the mixed film 14, the residue (foreign matter) of the resist film 13 is washed out together by elution of the mixed film 14 located under the resist film 13. That is, it is possible to suppress the remaining of the foreign matter in the space region $T_1$. As a result thereof, the resist pattern 20 having a small line edge roughness and excellent pattern accuracy can be formed.

As the developing solution for the resist film 13, an aqueous solution of alkalis can be use, like inorganic alkalis such as sodium hydroxide, potassium hydroxide, sodium carbonate, sodium silicate, sodium metasilicate and ammonia water, primary amines such as ethylamine and n-propylamine, secondary amines such as diethylamine and di-n-butylamine, tertiary amines such as triethylamine and methyldiethylamine, alcohol amines such as dimethylethanolamine and triethanolamine, quaternary ammonium such as tetramethylammonium hydroxide, tetraethylammonium hydroxide, quaternary ammonium and choline, cyclic amines such as hydroxide, pyrrole and piperidine, and the like. Further, an appropriate amount of alcohol such as isopropyl alcohol, and the nonionic surfactant may be added to the above-mentioned alkali aqueous solution and used. Among them, quaternary ammonium hydroxides is preferably used, and more preferably tetramethylammonium hydroxide and choline are used as the developing solution.

(Etching Step)

Figure 3C:
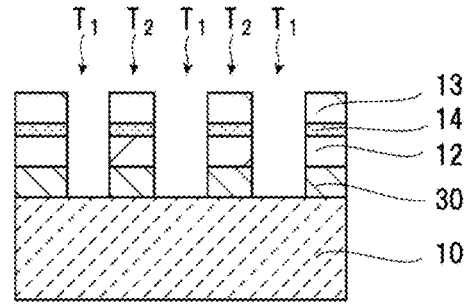

Subsequently, as shown in FIG. 3(c), the resist underlayer film 12 and the thin film 11 are etched, using the predetermined resist pattern 20 as a mask. By etching, the thin film 11 is patterned to form the predetermined transfer pattern 30. Since the transfer pattern 30 is formed using the resist pattern 20 as a mask which is excellent in pattern accuracy with few remaining foreign matters, there are few foreign matter defects. Therefore, the line edge roughness of the transfer pattern 30 is small, and the pattern accuracy is excellent.

(Peeling and Removing Step)

Figure 3D:
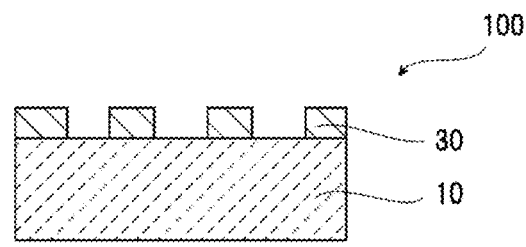

Finally, as shown in FIG. 3(d), the transfer mask 100 of this embodiment is obtained by peeling and removing the resist pattern and the like.

In this embodiment, a case where the resist film 13 contains the positive resist component has been described, but the present invention is not limited thereto. Even when the resist film 13 contains a negative resist component, the same effect can be obtained.

4. Effect of this Embodiment

According to this embodiment, the following one or a plurality of effects can be exerted.

(a) According to the mask blank of this embodiment, the resist underlayer film 12 is made of the resist underlayer composition containing the polymer having the unit structure having a lactone ring and the unit structure having a hydroxyl group, and the mixed film 14 made of the mixed component 14' containing the resist underlayer composition and the resist composition, is provided between the resist underlayer film 12 and the resist film 13. Since the mixed film 14 contains the component (resist composition) of the resist film 13, it exhibits the same solubility as the resist film 13 in the developing solution by exposure. In addition, since the mixed film 14 contains the components (resist underlayer composition) of the resist underlayer film 12, the mixed film 14 is configured to have a slower elution rate (developing speed) in the developing solution than that of the resist film 13. Therefore, when the resist film 13 is developed, the resist film 13 is eluted first and then the mixed film 14 is eluted in the space region $T_1$. As a result thereof, even in a case where the resist film 13 is not eluted out in the space region $T_1$ and remained on the mixed film 14 or a dropout of the resist film 13 re-adheres onto the mixed film 14, the mixed film 14 located under the resist film 13 is eluted, so that the residue of the resist film 13 is washed out together. Accordingly, by providing the mixed film 14, it is possible to suppress the foreign matter deriving from the resist film 13 from remaining in the space region $T_1$ and suppress the foreign matter defect in the resist pattern 20, when the resist film 13 is developed.

(b) Further, by forming the mixed film 14 between the resist film 13 and the resist underlayer film 12, the resist film 13 and the resist underlayer film 12 can be integrally formed. That is, the resist film 13 can be fixed on the resist underlayer film 12 via the mixed film 14. Therefore, the adhesion between the resist underlayer film 12 and the resist film 13 can be improved. As a result thereof, when the resist film 13 is developed and the resist pattern 20 is formed, the collapse of the resist pattern 20 can be suppressed. More specifically, as shown in FIG. 3(b), as a width of the line region $T_2$ becomes narrower due to miniaturization of the resist pattern 20, the width becomes smaller compared to a height (thickness) in the line region $T_2$, and therefore the collapse of the resist pattern 20 easily occurs. In this point, the resist film 13 is fixed on the resist underlayer film 12 by the mixed film 14 in this embodiment, and therefore the adhesion between the resist pattern 20 and the resist underlayer film 12 is improved, and the collapse of the resist pattern 20 can be suppressed.

(c) Further, in the transfer mask 100 made of the mask blank of this embodiment, the foreign matter remained in the resist pattern 20 can be reduced, and therefore the pattern accuracy of the transfer pattern 30 can be improved. For example, the edge of the resist pattern 20 can be formed linearly by reducing the foreign matter defect, and therefore the line edge roughness of the transfer pattern 30 can be reduced.

(d) Further, the polymer contained in the resist underlayer composition further contains the unit structure having an aryl group or an arylalkyl group. This makes it possible to lower the solubility of the resist underlayer film 12 in the resist composition and further suppress excessive intermixing. In other words, it is possible to suppress reduction of the resolution of the resist film 13 due to excessive intermixing.

(e) Further, the resist underlayer composition contains polynuclear phenol. This makes it possible to introduce a three-dimensional crosslinked structure to the resist underlying film 12, and further suppress the excessive intermixing between the resist underlying film 12 and the resist composition.

(f) Further, the resist underlayer composition contains the crosslinking compound as the crosslinking agent. According to the crosslinking compound, the ratio of the low molecular weight component in the resist underlayer film 12 can be reduced by crosslinking the resist underlayer film 12. This makes it possible to lower the solubility of the resist underlayer film 12 in the resist composition and further suppress the excessive intermixing.

5. Modified Example

In the abovementioned embodiment, the binary mask blank, which is a transmission type mask blank, has been described, but the present invention is not limited thereto. By providing, for example, a phase shift film, or a phase shift film and a light-shielding film on the substrate 10 as the thin film 11, a phase shift mask blank which is a transmission type mask blank can be formed. The phase shift film is made of a material containing silicon (Si), or a material containing a transition metal and silicon (Si), or the like. The phase shift film may be composed of a single layer or a plurality of layers.

Further, for example, by providing the light-shielding film as the thin film 11, a substrate engraved type Levenson phase shift mask blank can be formed. Further, for example, by providing an etching mask film as the thin film 11, the phase shift mask blank of a chromeless type or a nanoimprinting mold can be formed.

Further, in the binary mask blank and the phase shift type mask blank, an etching mask film may be provided on the light-shielding film. The material of the etching mask film is selected from materials having resistance to an etchant used for patterning the light-shielding film. In a case where the material of the light-shielding film is a material containing chromium (Cr) for example, the material containing silicon (Si) is selected as the material of the etching mask film. Further, in a case where the material of the light-shielding film is the material containing silicon (Si) or the material containing a transition metal and silicon (Si), as the material of the etching mask film, for example the material containing chromium (Cr) is selected. The etching mask film may be composed of a single layer or a plurality of layers.

Further, in the present invention, a reflective mask blank for EUV exposure or the like can be formed. In this case, a substrate made of a material with low thermal expansion is used as the substrate 10. For example, a substrate made of $SiO_2$—$TiO_2$ based glass (binary ($SiO_2$—$TiO_2$) and ternary ($SiO_2$—$TiO_2$—$SnO_2$ etc.)) or for example $SiO_2$—$Al_2O_3$—$Li_2O$ based crystallized glass can be used.

In the reflective mask blank, a multilayer reflective film that makes EUV light reflected, a protective film for protecting the multilayer reflective film from dry cleaning or wet cleaning in the manufacturing step of the transfer mask, and an absorber film for forming a transfer pattern on the multilayer reflective film or the protective film, are provided as the thin film 11.

As the multilayer reflective film used in EUV light region, it is also possible to use Ru/Si periodic multilayer film, Mo/Be periodic multilayer film, Mo compound/Si compound periodic multilayer film, Si/Nb periodic multilayer film, Si/Mo/Ru periodic multilayer film, Si/Mo/Ru/Mo periodic multilayer film, Si/Ru/Mo/Ru periodic multilayer reflective film, in addition to Mo/Si periodic multilayer film.

Further, the material of the protective film is selected from for example Ru, Ru—(Nb, Zr, Y, B, Ti, La, Mo), Si—(Ru, Rh, Cr, B), Si, Zr, Nb, La, B and the like. Among them, when a material containing Ru is used, the reflectance characteristics of the multilayer reflective film become better.

Further, as the material of the absorber film, for example, Ta alone, or the material mainly composed of Ta is used. The material mainly composed of Ta is usually an alloy of Ta. A crystalline state of such an absorber film is preferably formed in an amorphous or a microcrystalline structure from a viewpoint of smoothness and flatness. As the material mainly composed of Ta, a material containing Ta and B, a material containing Ta and N, a material containing Ta and B and further containing at least one of O and N, a material containing Ta and Si, a material containing Ta, Si and N, a material containing Ta and Ge, or a material containing Ta, Ga, and N, or the like can be used. Further, for example, by adding B, Si, Ge or the like to Ta, an amorphous structure can be easily obtained and smoothness can be improved. Further, by adding N and O Ta, the resistance to oxidation is improved, and therefore stability over time can be improved. The absorber film may be composed of a single layer or a plurality of layers.

EXAMPLES

Examples of the present invention will be described hereafter in detail.

A synthesis example of the polymer component constituting the resist underlayer composition used for the mask blank will be described first.

Synthesis Example 1

10 g (0.057 mol) of benzyl methacrylate, 19.2 g (0.133 mol) of hydroxypropyl methacrylate and 10.8 g (0.063 mol) of gamma-butyrolactone methacrylate were dissolved in 128 g of propylene glycol monomethyl ether, and thereafter an inside of a flask was replaced with nitrogen and the temperature was raised to 80° C.

Thereafter, 1.6 g of 2,2'-azobisisobutyrate methyl was dissolved in 30.4 g of propylene glycol monomethyl ether, added under nitrogen pressure, and reacted at 80° C. for 24 hours, to thereby obtain the polymer. The weight average molecular weight Mw of the obtained polymer (resin) was 10,000 in terms of polystyrene.

Synthesis Example 2

10 g (0.057 mol) of benzyl methacrylate, 19.2 g (0.133 mol) of hydroxypropyl methacrylate and 10.8 g (0.063 mol) of gamma-butyrolactone methacrylate were dissolved in 120 g of propylene glycol monomethyl ether, and the inside of the flask was replaced with nitrogen and the temperature was raised to 60° C.

Thereafter, 0.4 g of 2,2'-azobisisobutyronitrile was dissolved in 39.6 g of propylene glycol monomethyl ether, added under nitrogen pressure, and reacted at 60° C. for 24 hours, to thereby obtain the polymer. The weight average molecular weight Mw of the obtained polymer (resin) was 87000 in terms of polystyrene.

Synthesis Example 3

10 g (0.057 mol) of benzyl methacrylate, 10 g (0.069 mol) of hydroxypropyl methacrylate, and 10.3 g (0.061 mol) of gamma butyl lactone methacrylate were dissolved in 84.848 g of ethyl lactate, and thereafter the inside of the flask was replaced with nitrogen and the temperature was raised to 70° C.

Thereafter, 0.364 g of 2,2'-azobisisobutyronitrile was dissolved in 36 g of ethyl lactate, added under nitrogen pressure, and reacted at 70° C. for 24 hours, to thereby obtain the polymer. The weight average molecular weight Mw of the obtained polymer (resin) was 22,000 in terms of polystyrene.

Synthesis Example 4

10 g (0.057 mol) of benzyl methacrylate, 10 g (0.069 mol) of hydroxypropyl methacrylate and 10.3 g (0.061 mol) of gamma-butyrolactone methacrylate were dissolved in 90.909 g of ethyl lactate, and thereafter the inside of the flask was replaced with nitrogen, and the temperature was raised to 70° C.

Thereafter, 0.909 g of 2,2'-azobisisobutyronitrile was dissolved in 29.394 g of ethyl lactate, added under nitrogen pressure and reacted at 70° C. for 24 hours, to thereby obtain the polymer. The weight average molecular weight Mw of the obtained polymer (resin) was 12,000 in terms of polystyrene.

Synthesis Example 5

10 g (0.057 mol) of benzyl methacrylate, 19.2 g (0.133 mol) of hydroxypropyl methacrylate and 10.8 g (0.063 mol) of gamma-butyrolactone methacrylate were dissolved in 120 g of ethyl lactate, and thereafter the inside of the flask was replaced with nitrogen, and the temperature was raised to 60° C.

Thereafter, 0.4 g of 2,2'-azobisisobutyronitrile was dissolved in 39.6 g of ethyl lactate, added under nitrogen pressure, and reacted at 60° C. for 24 hours, to thereby obtain the polymer. The weight average molecular weight Mw of the obtained polymer (resin) was 82000 in terms of polystyrene.

Synthesis Example 6

10 g (0.057 mol) of benzyl methacrylate, 27.778 g (0.193 mol) of hydroxypropyl methacrylate and 17.778 g (0.104 mol) of gamma-butyrolactone methacrylate were dissolved in 155.556 g of ethyl lactate, and thereafter the inside of the flask was replaced with nitrogen and the temperature was raised to 70° C.

Thereafter, 0.667 g of 2,2'-azobisisobutyronitrile was dissolved in 66 g of ethyl lactate, added under nitrogen pressure, and reacted at 70° C. for 24 hours, to thereby obtain the polymer. The weight average molecular weight Mw of the obtained polymer (resin) was 25000 in terms of polystyrene.

Comparative Synthesis Example 1

10 g (0.057 mol) of benzyl methacrylate and 19.2 g (0.133 mol) of hydroxypropyl methacrylate were dissolved in 128 g of propylene glycol monomethyl ether, and the inside of the flask was replaced with nitrogen and the temperature was raised to 80° C.

Thereafter, 1.6 g of methyl 2,2'-azobisisobutyrate was dissolved in 30.4 g of propylene glycol monomethyl ether, added under nitrogen pressure, and reacted at 80° C. for 24 hours, to thereby obtain the polymer. The weight average molecular weight Mw of the obtained polymer (resin) was 20,000 in terms of polystyrene.

Next, the resist underlayer composition was prepared using the polymer obtained in the synthesis example, to thereby prepare the mask blank and the transfer mask using the resist underlayer composition.

Example 1

(Formulation of Resist Underlayer Composition)

1 g of the resin obtained in synthesis example 1, 0.05 g of tetramethoxymethylglycoluril as a crosslinking agent, 0.003 g of pyridinium paratoluenesulfonic acid as a crosslinking catalyst, and 0.006 g of bis (4-hydroxyphenyl) sulfone as a pattern shape regulator, were dissolved in 88.96 g of propylene glycol monomethyl ether and 10 g of propylene glycol monomethyl ether acetate as solvents, to thereby obtain the resist underlayer composition.

(Preparation of the Mask Blank)

On the translucent substrate made of synthetic quartz glass, a light semi-transmitting film, a light-shielding film and a hard mask were respectively formed as a thin film by a sputtering method. Specifically, a single-layer MoSiN film (thickness: 69 nm) was formed on the transparent substrate, as the light semi-transmitting film. More specifically, in a mixed gas atmosphere of argon (Ar), nitrogen ($N_2$) and helium (He), and using a mixed target of molybdenum (Mo) and silicon (Si) (Mo:Si=10 mol %:90 mol % with a gas pressure set to 0.3 Pa and a power of the DC power source set to 3.0 kW at a gas flow rate ratio of Ar:$N_2$:He=5:49:46), MoSiN film composed of molybdenum, silicon, and nitrogen was formed by reactive sputtering (DC sputtering) so as to have a film thickness of 69 nm. Subsequently, heat treatment was applied to the transparent substrate with MoSiN film formed thereon, using a heating furnace, with a heating temperature set to 450° C. in the atmosphere, and a heating time set to 1 hour. In this MoSiN film, a transmittance was 6.16%, and a phase difference was 184.4 degrees obtained by ArF excimer laser.

Subsequently, three layers of CrOCN layer (thickness: 30 nm), CrN layer (thickness: 4 nm) and CrOCN layer (thickness: 14 nm) were formed in this order as a light-shielding film. Specifically, a CrOCN layer with a film thickness of 30 nm was formed, in a mixed gas atmosphere of argon (Ar), carbon dioxide ($CO_2$), nitrogen ($N_2$) and helium (He) (gas pressure 0.2 Pa, and gas flow rate ratio Ar:$CO_2$:$N_2$:He=20:35:10:30), using a chromium (Cr) target as a sputtering target, with a power of the DC power source set to 1.7 kW, and by reactive sputtering (DC sputtering). Subsequently, CrN layer with a film thickness of 4 nm was formed in a mixed gas atmosphere of argon (Ar) and nitrogen ($N_2$) (gas pressure 0.1 Pa, gas flow rate ratio Ar:$N_2$=25:5), with the power of the DC power source set to 1.7 kW, and by reactive sputtering (DC sputtering)). Finally, CrOCN layer with a film thickness of 14 nm was formed, in a mixed gas atmosphere of argon (Ar), carbon dioxide ($CO_2$), nitrogen ($N_2$) and helium (He) (gas pressure 0.2 Pa, gas flow ratio Ar:$CO_2$:$N_2$:He=20:35:5:30), with a power of the DC power source set to 1.7 kW, and by reactive sputtering (DC sputtering). As a result thereof, a chromium based light-shielding film of a three layer structure with a film thickness of 48 nm in total was formed.

Such a light-shielding film is adjusted so that an optical density (OD) is 3.0 in a wavelength of 193 nm of the ArF excimer laser exposure light in a lamination structure with the light semi-transmitting film. A surface reflectance of the light-shielding film in the wavelength of the exposure light was 20%.

Then, the surface of the formed thin film was subjected to HMDS treatment under predetermined conditions.

Next, the prepared resist underlayer composition was applied on the thin film by a spin coating method. Thereafter, the resist underlayer film (thickness: 10 nm) was formed by heating and crosslinking the resist underlayer composition under predetermined conditions. Heating was performed for 4 minutes to raise the temperature from room temperature (20° C.) to 200° C. and then heat treatment was performed for 6 minutes.

Next, a chemically amplified resist ("SLV 12 M negative resist" manufactured by Fuji Film Electronics Materials Co., Ltd.) was applied on the resist underlayer film by a spin coating method. Thereafter, the resist film (thickness: 160 nm) was formed by heating at 130° C. for 10 minutes. Simultaneously with the formation of the resist film, the mixed film was formed so as to be interposed between the resist underlayer film and the resist film. Whereby, the mask blank of example 1 was obtained.

Examination was made on the boundary portion between the resist underlayer film and the resist film of this resist-attached mask blank, and as a result, there was no definite boundary or the interface between the resist underlayer film and the resist film, and a mixed region (mixed film) with a thickness of about 5 nm or less was confirmed.

(Preparation of the Transfer Mask)

Subsequently, a predetermined transfer pattern was formed on the obtained mask blank, to thereby prepare the transfer mask. Specifically, the mask blank was exposed to electron beams and baked at 120° C. after exposure. Thereafter, development was performed using a developing solution (tetramethylamino hydride (TMAH) aqueous solution), to thereby form the resist pattern.

Next, a thin film pattern was formed. First, the chromium based light-shielding film was dry-etched by a mixed gas of chlorine and oxygen, using the resist pattern as a mask. Next, the phase shift mask film was dry-etched by a fluorine-based gas ($SF_6$ gas), using the resist pattern and the pattern formed on the light shielding film as a mask. Next, the resist film was formed again to form a resist pattern for forming a light shielding band pattern. The light-shielding film pattern remained in the pattern forming region was removed by dry-edging by a mixed gas of chlorine and oxygen, using the resist pattern as a mask, to thereby complete the transfer mask.

(Evaluation Method)

The mask blank of this example was evaluated by the following method.

<Resist Pattern Evaluation 1: Resolution Evaluation>

When the transfer pattern was formed by the above procedure, resolution was confirmed as 100 nm line and space (L/S). An image observed by the electron microscope is shown in FIG. 4.

Figure 4:
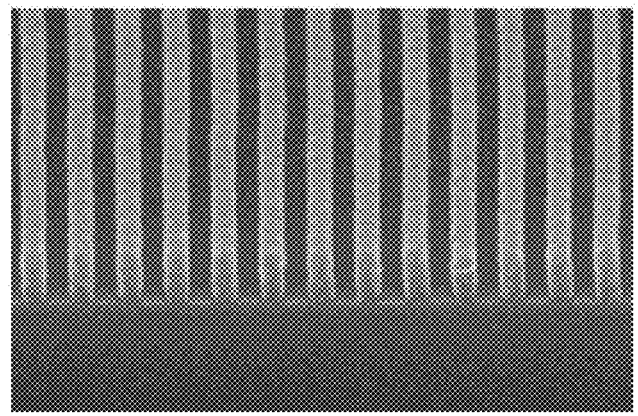
FIG. 4 is an electron micrograph of a resist pattern in the mask blank of example 1.

As shown in FIG. 4, a straight line could be formed without pattern collapse. From this fact, it is understood that the adhesion between the resist film (resist pattern) and the resist underlayer film is sufficiently secured by the resist underlayer film of this example.

<Resist Pattern Evaluation 2: Foreign Matter Defect>

Figure 5:
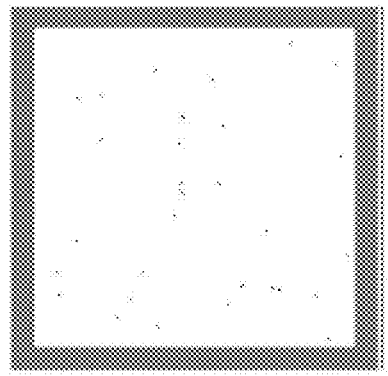
FIG. 5 is a pixel histogram of the mask blank of example 1.

The foreign matter defect was confirmed by measuring a pixel histogram by an optical measurement method, for the mask blank after forming the resist pattern, and detecting a defect (pixel) of 200 nm or more. In this example, as shown in FIG. 5, although pixels due to the foreign matter defect were slightly confirmed, it was found that the density was very low.

Examples 2 to 6

In examples 2 to 6, the resist underlayer composition was formulated in the same manner as in example 1 and the mask blank and the transfer mask was prepared, except that 1 g of the resin obtained in synthesis examples 2 to 6 was used in example 1 in place of 1 g of the resin obtained in synthesis example 1.

In examples 2 to 6, resolution was confirmed, with a target line width set as a line width of 100 nm line and space (L/S), and it was confirmed that the same results as in example 1 were obtained.

Further, when the foreign matter was confirmed using a pixel histogram, dispersion of low density defects was simply confirmed similarly to example 1.

As a result of examining the boundary portion between the resist underlayer film and the resist film of this resist mask blank, there was no definite boundary on the interface between the resist underlayer film and the resist film, and a mixed region with a thickness of about 5 nm or less was confirmed.

Comparative Example 1

In comparative example 1, a resist underlayer composition was formulated in the same manner as in example 1 and the mask blank and the transfer mask was prepared, except that 1 g of resin obtained in comparative synthesis example 1 was used in example 1 in place of 1 g of the resin obtained in synthesis example 1.

When examining the boundary portion between the resist underlayer film and the resist film of this resist mask blank, it was confirmed that there was no definite boundary on the interface between the resist underlayer film and the resist film as a result. That is, in comparative example 1, it was confirmed that the mixed region was not formed on the interface.

In the line and space (L/S) of the target line width of 100 nm, pattern collapse occurred and a clear pattern could not be formed.

Figure 6:
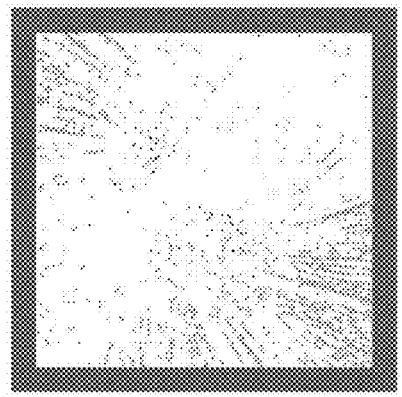
FIG. 6 is a pixel histogram of the mask blank of comparative example 1.

In addition, as a result of confirming the foreign matter using the pixel histogram, as shown in FIG. 6, a high density defect was confirmed in such a manner that a defect considered as the foreign matter due to resist residue was continuous on a streak.

INDUSTRIAL APPLICABILITY

There is provided the resist underlayer film for a mask blank capable of reducing an adverse influence exerted by the substrate and the thin film formed on the substrate and electron beams, and forming a good resist pattern of a straight shape without pattern collapse, with less foreign matters due to resist residue.

The invention claimed is:

1. A mask blank, comprising:
   a substrate;
   a thin film for forming a transfer pattern on the substrate;
   a resist underlayer film provided on the thin film and made of a resist underlayer composition containing a polymer having a unit structure having a lactone ring and a unit structure having a hydroxyl group;
   a resist film provided on the resist underlayer film and made of a resist composition; and
   a mixed film provided so as to be interposed between the resist underlayer film and the resist film and made of a mixed component containing the resist underlayer composition and the resist composition.

2. The mask blank according to claim 1, wherein the polymer further contains a unit structure having an aryl group or an arylalkyl group.

3. The mask blank according to claim 1, wherein the polymer contains a copolymer unit structure comprising repeating units of lactone (meth) acrylate and hydroxyalkyl (meth) acrylate.

4. The mask blank according to claim 1, wherein the polymer contains a copolymer unit structure comprising repeating units of lactone (meth) acrylate, hydroxyalkyl (meth) acrylate and phenyl (meth) acrylate or benzyl (meth) acrylate.

5. The mask blank according to claim 1, wherein the polymer is a polymer represented by formula (1) including a unit structure of formula (1-1) and a unit structure of formula (1-2), or a polymer represented by formula (2) including a unit structure of formula (2-1) and a unit structure of formula (2-2) and a unit structure of formula (2-3),

[Formula 1]

Formula (1)

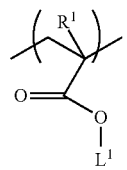

Formula (1-1)

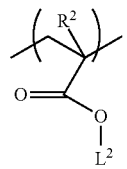

Formula (1-2)

Formula (2)

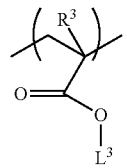

Formula (2-1)

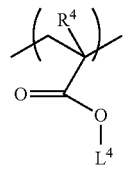

Formula (2-2)

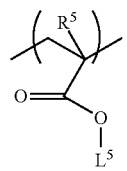

Formula (2-3)

wherein, $R^1$, $R^2$, $R^3$, $R^4$ and $R^5$ each represents a hydrogen atom or a methyl group, $L^2$ and $L^4$ each represents a hydroxyalkyl group having 1 to 10 carbon atoms, $L^5$ represents a phenyl group or a benzyl group, $L^1$ and $L^3$ each represents formula (L1-1) or formula (L1-2),

[Formula 2]

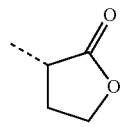

Formula (L1-1)

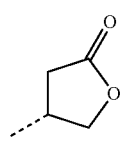

Formula (L1-2)

wherein, a dotted line indicates a bond with the unit structure of the polymer.

6. The mask blank according to claim 1, wherein the resist underlayer composition further contains polynuclear phenol.

7. The mask blank according to claim 6, wherein the polynuclear phenol is at least one of a compound represented by formula (b-1), a compound represented by formula (b-2), or a compound represented by formula (b 3),

[Formula 3]

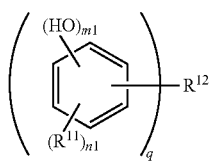

Formula (b-1)

wherein, in formula (b-1), each $R^{11}$ is a substituent of a hydrogen atom of a benzene ring, and is an organic group composed of a hydroxyl group, a halogen group, an alkyl group having 1 to 10 carbon atoms, an aryl group having 6 to 18 carbon atoms, an arylalkyl group having 7 to 25 carbon atoms, an alkylcarbonyl group having 2 to 10 carbon atoms, an alkylcarbonyloxy group having 2 to 10 carbon atoms, an alkylcarbonylamino group having 2 to 10 carbon atoms, an aryloxyalkyl group having 7 to 10 carbon atoms, an alkoxy group having 1 to 6 carbon atoms, or a combination thereof, and $R^{12}$ represents a single bond, or a divalent to tetravalent hydrocarbon group having 1 to 10 carbon atoms which may be substituted with halogen atoms, a divalent to tetravalent arylalkyl group having 7 to 25 carbon atoms which may be substituted with halogen atoms, or a sulfonyl group, m1 is an integer of 1 to 5, and n1 is an integer of 0≤n1≤5−m1, and q is an integer of 2 to 4,

[Formula 4]

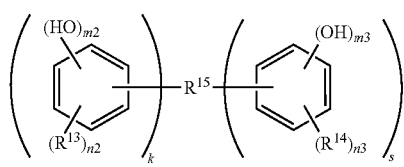

Formula (b-2)

wherein, $R^{13}$ and $R^{14}$ in formula (b-2) are the same as $R^{11}$ in formula (b-1) respectively, and $R^{15}$ represents a single bond or a divalent to hexavalent hydrocarbon group having 1 to 10 carbon atoms which may be substituted with halogen atoms, a divalent to hexavalent arylalkyl group having 7 to 25 carbon atoms which may be substituted with halogen atoms, or a sulfonyl group, m2 and m3 is an integer of 1 to 5, n2 and n3 are integers of 0≤n2≤5−m2 and 0≤n3≤5−m3, and k and s are each independently an integer of 1 to 3

[Formula 5]

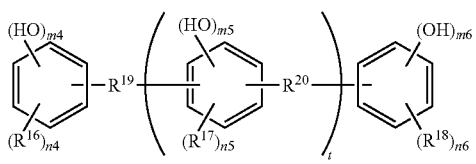

Formula (b-3)

wherein, $R^{16}$, $R^{17}$, and $R^{18}$ in formula (b-3) are the same as $R^{11}$ in formula (b-1) respectively, and $R^{19}$ and $R^{20}$ represent a single bond or a divalent hydrocarbon group having 1 to 10 carbon atoms which may be substituted with halogen atoms, a divalent arylalkyl group having 7 to 25 carbon atoms which may be substituted with halogen atoms, or a sulfonyl group, m5 is an integer of 1 to 4, m4 and m6 are integers of 1 to 5 respectively, n5 is 0≤n5≤4−m5, n4 and n6 are integers of 0≤n4≤5−m4 and 0≤n6≤5−m6 respectively, and t is an integer of 1 to 4.

8. The mask blank according to claim 1, wherein the resist underlayer composition further contains a crosslinking compound.

9. The mask blank according to claim 1, wherein the resist underlayer composition further contains an acid compound.

10. A method for manufacturing a mask blank, comprising:
    forming a thin film for forming a transfer pattern on a substrate;
    forming a resist underlayer film on the thin film by applying a resist underlayer composition containing a polymer including a unit structure having a lactone ring and a unit structure having a hydroxyl group and heating the same; and
    forming a resist film by applying a resist composition on the resist underlayer film and heating the same,
    wherein in forming the resist film, a surface layer portion of the resist underlayer film is dissolved by applying the resist composition on the resist underlayer film, and a mixed component of a dissolved component of the resist underlayer film and the resist composition is formed on an interface between the resist underlayer film and the applied resist composition, and
    the resist film is formed by heating the mixed component together with the resist composition, and a mixed film is formed so as to be interposed between the resist underlayer film and the resist film.

11. A method for manufacturing a transfer mask, comprising:
    forming a resist pattern by exposing and developing the resist film and the mixed film of the mask blank manufactured by the method for manufacturing a mask blank of claim 10; and
    forming a transfer pattern on the substrate by etching the resist underlayer film and the thin film using the resist pattern as a mask.

* * * * *